United States Patent
Wenger et al.

(10) Patent No.: US 10,546,767 B2
(45) Date of Patent: Jan. 28, 2020

(54) WAFER BOX, WAFER STACKING AID, WAFER CARRIER, WAFER TRANSPORT SYSTEM, METHOD FOR LOADING A WAFER BOX WITH WAFERS AND METHOD FOR REMOVING WAFERS FROM A WAFER BOX

(71) Applicant: Infineon Technologies AG, Neubiberg (DE)

(72) Inventors: Nina Wenger, Villach (AT); Manfred Mengel, Bad Abbach (DE); Andreas Niederhofer, Regensburg (DE); Holger Tamme, Kreischa (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 116 days.

(21) Appl. No.: 15/662,295

(22) Filed: Jul. 28, 2017

(65) Prior Publication Data
US 2018/0033662 A1    Feb. 1, 2018

(30) Foreign Application Priority Data
Jul. 28, 2016    (DE) .................. 10 2016 113 925

(51) Int. Cl.
*H01L 21/673*    (2006.01)

(52) U.S. Cl.
CPC .. *H01L 21/67346* (2013.01); *H01L 21/67309* (2013.01)

(58) Field of Classification Search
CPC ......... H01L 21/67346; H01L 21/67386; H01L 21/67303; H01L 21/67309
USPC ................... 206/710, 711, 493; 211/41.18
See application file for complete search history.

(56) References Cited

U.S. PATENT DOCUMENTS

| 7,431,162 B2 * | 10/2008 | Forsyth ............. H01L 21/67353 206/710 |
| 7,892,504 B2 * | 2/2011 | Taike .................. B01L 3/50855 206/565 |
| 2008/0302700 A1 | 12/2008 | Nyseth et al. |
| 2015/0030416 A1 | 1/2015 | Sakiya et al. |
| 2018/0033665 A1 * | 2/2018 | Niederhofer ...... H01L 21/67346 |
| 2018/0240696 A1 * | 8/2018 | Yoo ........................ H01L 21/02 |

FOREIGN PATENT DOCUMENTS

DE    19830640 A1    1/1999

\* cited by examiner

*Primary Examiner* — Steven A. Reynolds
(74) *Attorney, Agent, or Firm* — Viering, Jentschura & Partner MBB

(57) ABSTRACT

In various embodiments, a wafer box is provided. The wafer box may include a housing with a receiving space for receiving a stack comprising a plurality of wafers, each arranged above a housing base. The wafers are to be arranged with their main surfaces parallel to the housing base. The receiving space is delimited by the housing base and side walls arranged thereon. The wafer box may further include at least one base opening, arranged in the housing base, for receiving a guide structure of a wafer stacking aid. The guide structure is to be arranged in such a way that, on a side of the housing base on which the side walls are arranged, it extends out of the housing base in order to limit tilting of a wafer raised or lowered in the receiving space in a manner guided by the guide structure.

17 Claims, 20 Drawing Sheets

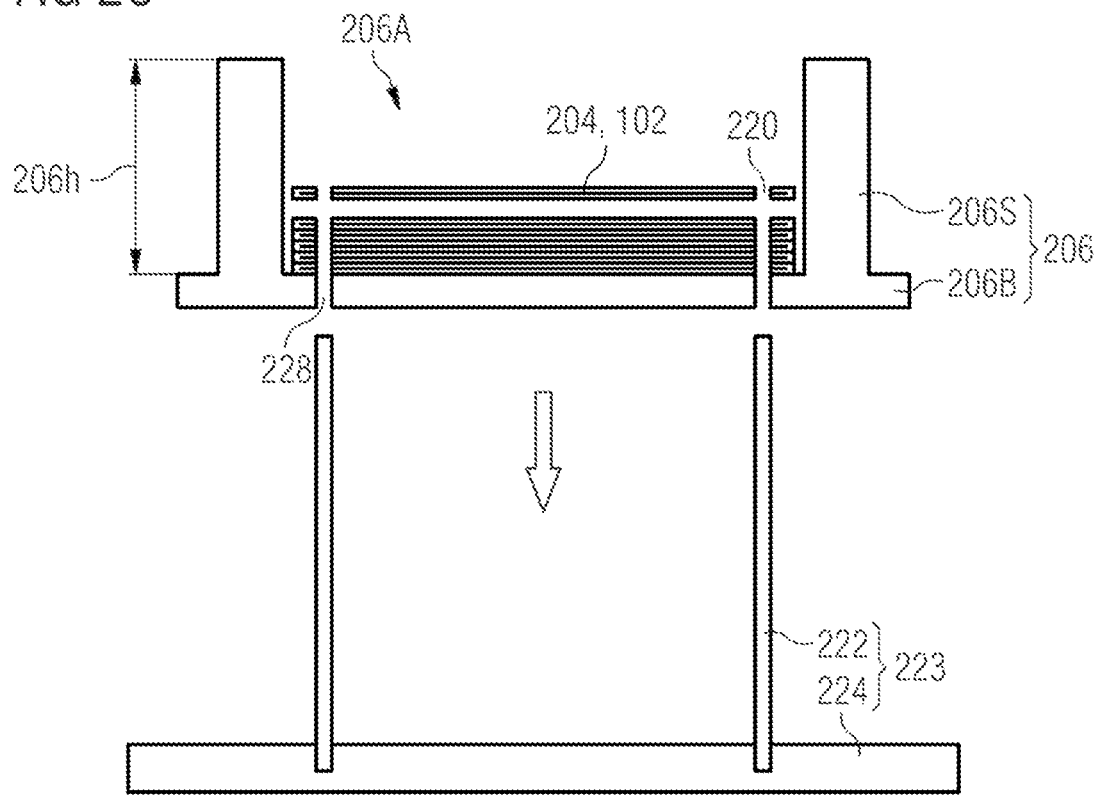
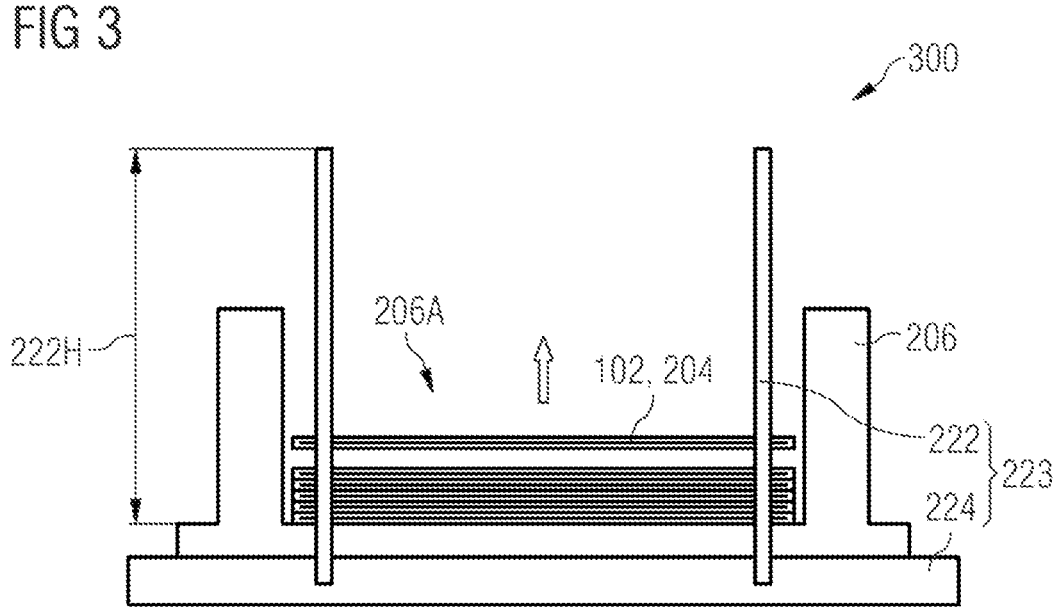

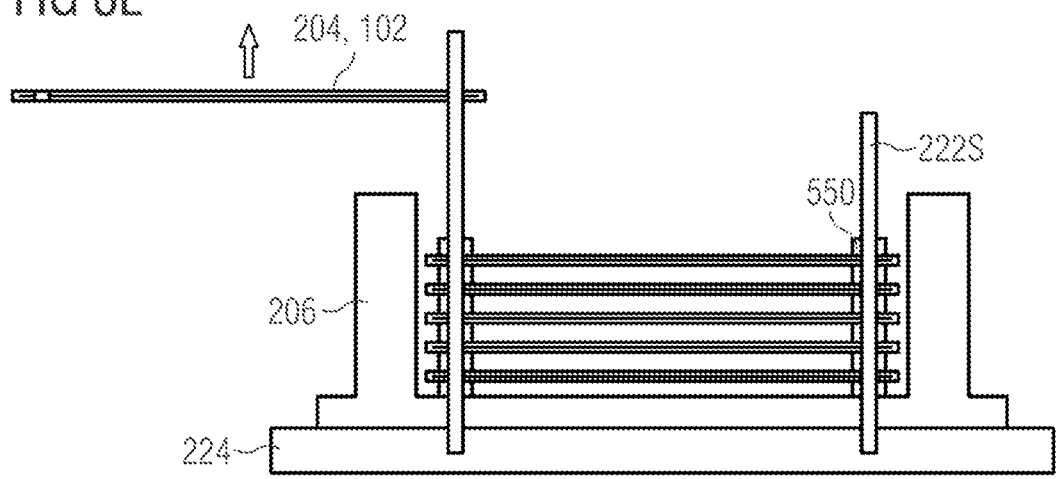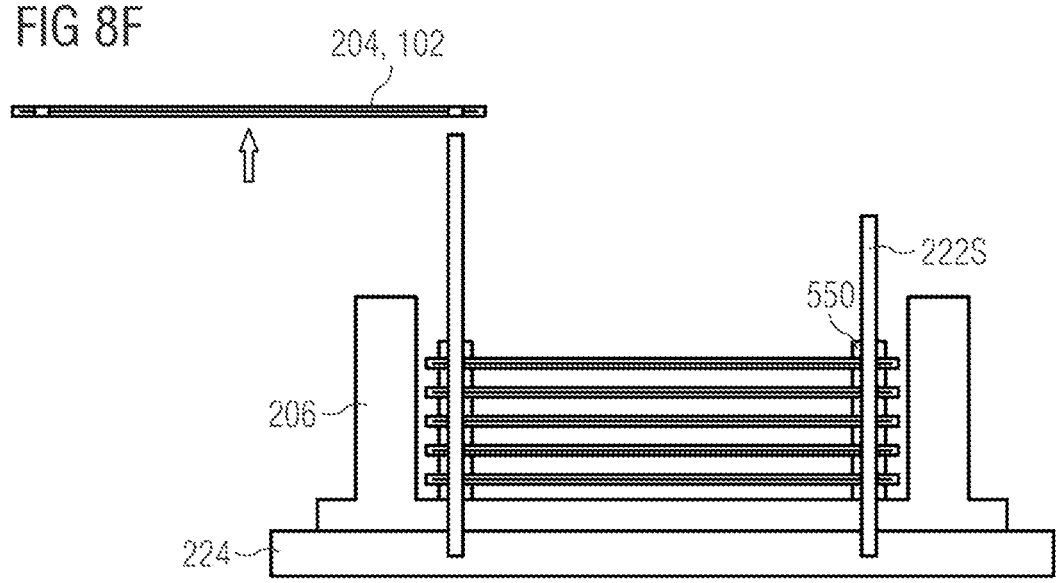

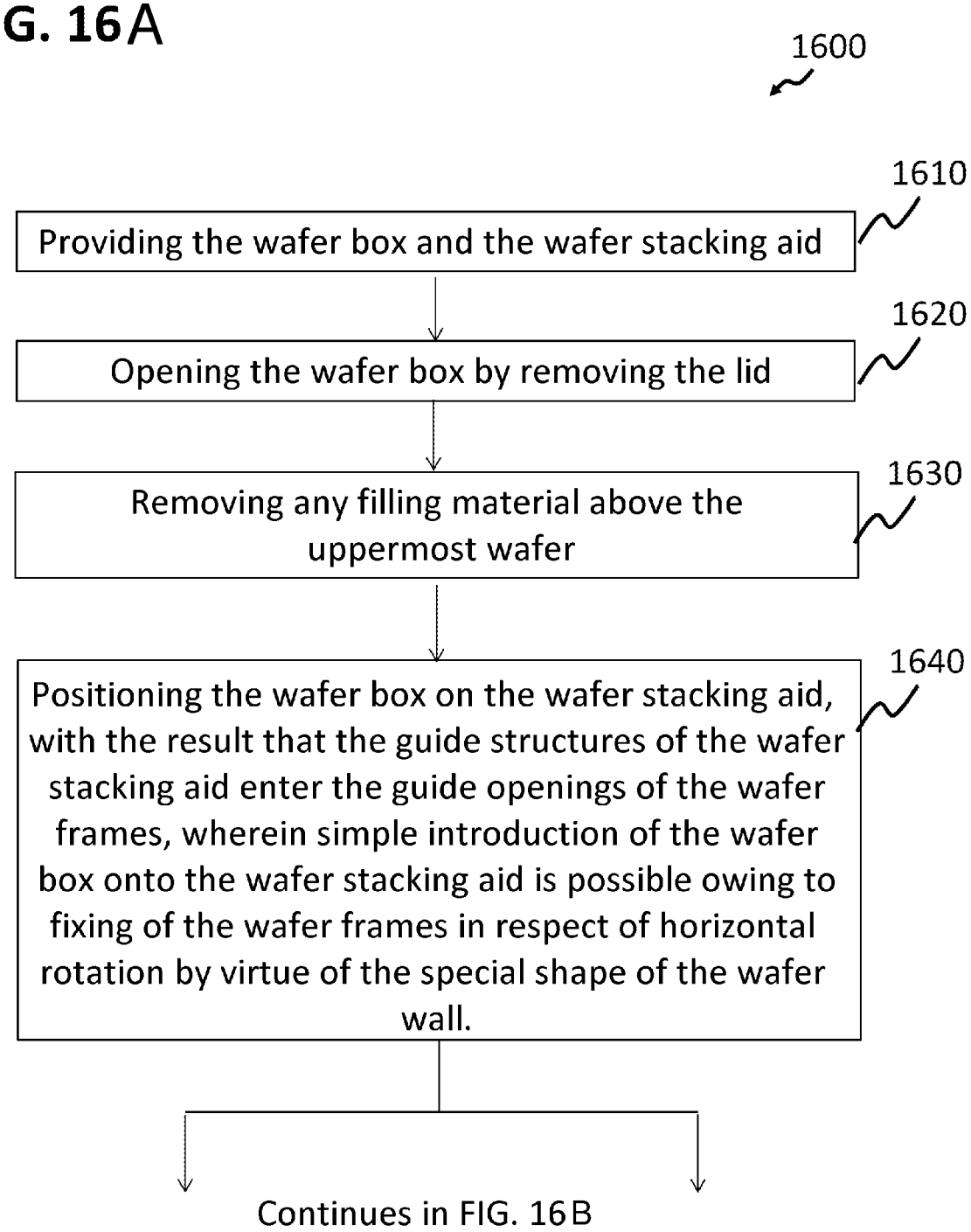

US 10,546,767 B2

WAFER BOX, WAFER STACKING AID, WAFER CARRIER, WAFER TRANSPORT SYSTEM, METHOD FOR LOADING A WAFER BOX WITH WAFERS AND METHOD FOR REMOVING WAFERS FROM A WAFER BOX

CROSS-REFERENCE TO RELATED APPLICATION

This application claims priority to German Patent Application Serial No. 10 2016 113 925.4, which was filed Jul. 28, 2016, and is incorporated herein by reference in its entirety.

TECHNICAL FIELD

Various embodiments relate generally to a wafer box, a wafer stacking aid for the wafer box, a wafer carrier, a wafer transport system, a method for loading a wafer box with wafers and a method for removing wafers from a wafer box.

BACKGROUND

As illustrated in FIG. 1, wafers 102 (mounted on wafer frames 104, for example) are usually packed in wafer boxes 106 for delivery to customers. In the case of manual loading and removal of the wafers, there can be damage to the wafers, e.g. scratches, if one of the wafers slides with its edge against a surface of the wafer underneath as it is inserted into the wafer box or removed from the wafer box, e.g. because the wafer inserted or removed is tilted during this process.

During downstream processing of the chips in a semiconductor housing, one difficulty can be that of tracing defects in a chip surface to scratches during removal (that is to say being able to exclude the possibility of scratches already being present in the state as delivered). Moreover, there is the possibility that scratches on the chip surface may not necessarily lead immediately to failure but only after stress during application or in reliability tests, making it difficult to detect the cause of the defect.

In order to limit the risk of chip damage during loading and removal of the wafer, the only possibility hitherto has been to use overdimensioned wafer boxes with increased insertion lengths ("pitches"). One effect here is that standard packaging machines cannot load these boxes in an automated way. Moreover, these larger boxes can cost approximately 2.5 times as much as a conventional "horizontal wafer box" (also referred to as a frame shipper). Furthermore, transport costs can be increased in using these larger wafer boxes since, with these boxes, the volumetric weight is approximately three times that of the horizontal wafer box. Moreover, there are as yet no larger wafer boxes for transporting entire lots, that is to say usually 25, of 300 mm wafers on sawing frames, which would in any case no longer be movable by hand owing to the heavy weight thereof.

SUMMARY

In various embodiments, a wafer box is provided. The wafer box may include a housing with a receiving space for receiving a stack comprising a plurality of wafers, each arranged above a housing base. The wafers are to be arranged with their main surfaces parallel to the housing base. The receiving space is delimited by the housing base and side walls arranged thereon. The wafer box may further include at least one base opening, arranged in the housing base, for receiving a guide structure of a wafer stacking aid. The guide structure is to be arranged in such a way that, on a side of the housing base on which the side walls are arranged, it extends out of the housing base in order to limit tilting of a wafer raised or lowered in the receiving space in a manner guided by the guide structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2C shows a schematic cross-sectional view of a wafer box with a stacking aid and wafer carriers according to various embodiments;

FIG. 3 shows a schematic cross-sectional view of a wafer box with a stacking aid and wafer carriers according to various embodiments;

FIGS. 8C to 8F each show a schematic cross-sectional view to illustrate removal of the wafer from a wafer box by means of a stacking aid according to various embodiments;

FIG. 16A and FIG. 16B show a flow diagram relating to a method for removing wafers from a wafer box according to various embodiments.

DESCRIPTION

The following detailed description refers to the accompanying drawings that show, by way of illustration, specific details and embodiments in which the invention may be practiced.

In the following detailed description, reference is made to the attached drawings, which form part of the description and in which specific embodiments in which the invention can be implemented are shown for illustration purposes. In this respect, directional terminology, such as "top", "bottom", "front", "rear", "forward", "rearward" etc. is used with reference to the orientation of the figure(s) described. Since components of embodiments can be positioned in a number of different orientations, the directional terminology is used only for illustration and is in no way restrictive. It is self-evident that other embodiments can be used and that structural or logical changes can be made without deviating from the scope of protection of the present invention. It is self-evident that the features of the various embodiments described herein can be combined with one another, unless specifically stated otherwise. The following detailed description should therefore not be understood in a restrictive sense, and the scope of protection of the present invention is defined by the attached claims.

In the scope of this description, the terms "linked", "connected" and "coupled" are used to describe both direct and indirect linking, direct or indirect connection and direct or indirect coupling. In the figures, identical or similar elements are provided with identical reference signs if this is appropriate.

Unless stated otherwise, raising the wafer in a wafer box or out of a wafer box should be taken to mean that the wafer is moved away from a base of the wafer box, e.g. also in a case where the wafer box is arranged with its base substantially parallel to the force of gravity during loading with wafers or removal of wafers and thus conventional raising (i.e. counter to the force of gravity) does not occur.

Figure 1:
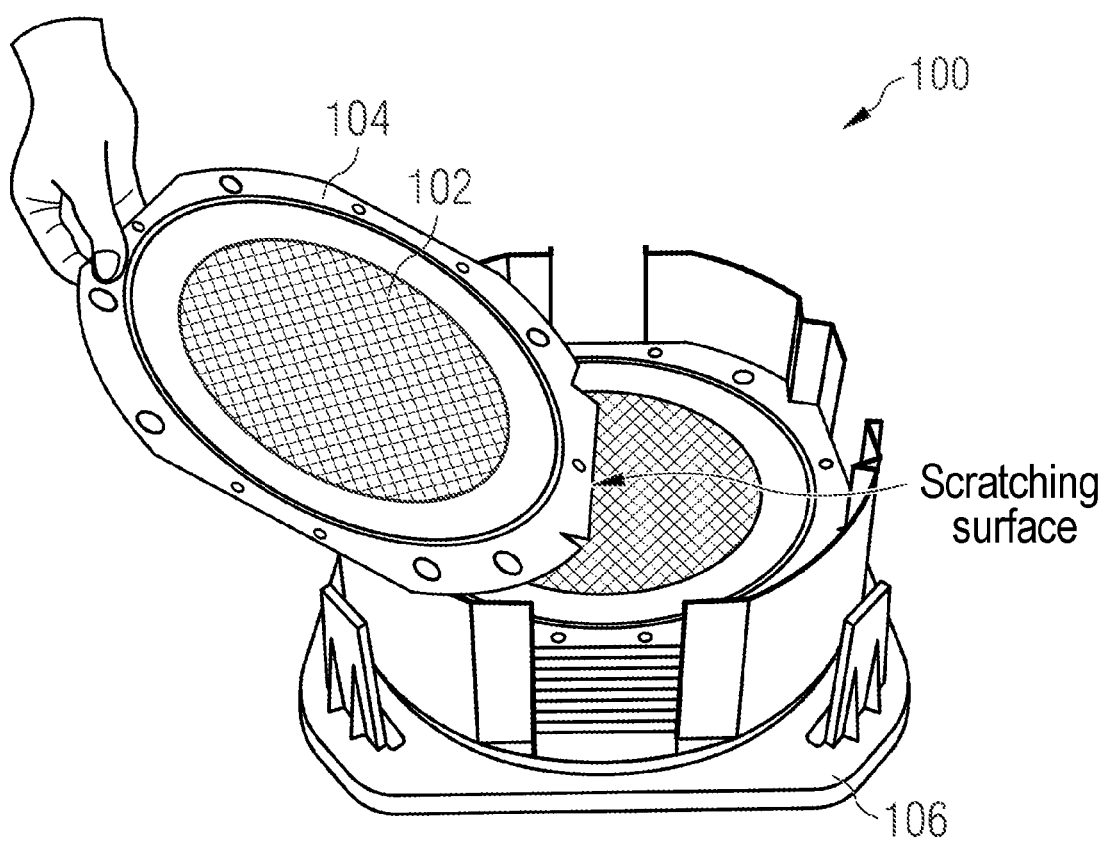
FIG. 1 shows a perspective view of a conventional wafer box, in which wafers are stacked.
Figure 2A:
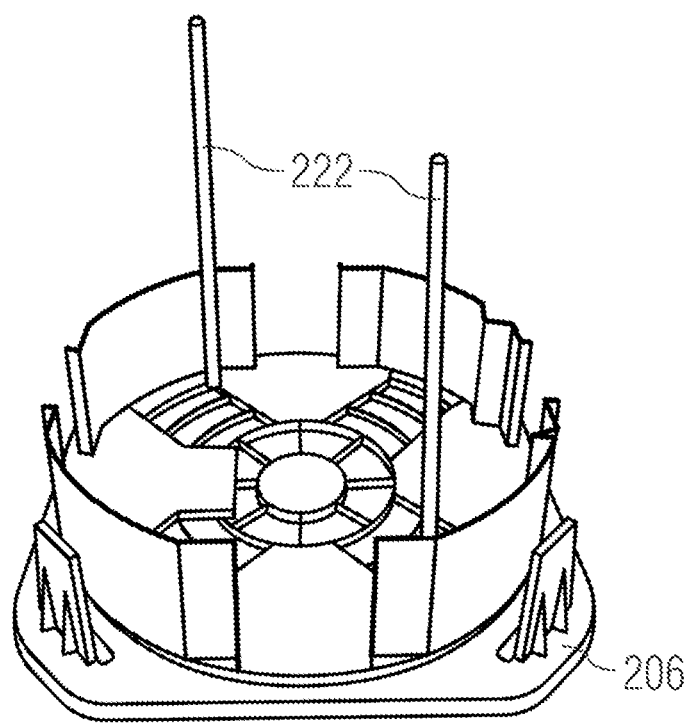
FIG. 2A shows a perspective view of a wafer box with a stacking aid according to various embodiments.

FIG. 2A shows a perspective view of a wafer box 206 with a wafer stacking aid 223, also referred to for short as stacking aid 223, according to various embodiments. Only guide structures 222 of the stacking aid 223 are visible in the perspective view, but see FIG. 2C for a cross-sectional view of the stacking aid 223, the wafer box 206 and a plurality of wafer carriers 204 according to various embodiments.

In various embodiments, the wafer box 206 can have a housing with a receiving space 206A for receiving a plurality of wafers 102, wherein each wafer 102 of the plurality of wafers 102 can be arranged on a wafer carrier 204, 226. The housing may furthermore have a housing base 206B. The receiving space 206A can be delimited by at least one side wall 206S and by at least part of the housing base 206B, wherein the at least one side wall 206S can extend from the housing base 206B to a height 206h above the housing base 206B. An edge, facing away from the housing base 206B, of the at least one side wall can be situated at a height (i.e. a distance) 206h above the housing base.

The receiving space 206A can be substantially cylindrical in various embodiments, e.g. in a case where the wafer carriers 204, 226 are formed as a substantially circular surface. In various embodiments, the receiving space 206A can have a different shape, e.g. cuboidal, cubic or some other suitable shape.

In various embodiments, the wafer box 206 can be configured in such a way that the plurality of wafers 102 therein can be arranged with main surfaces of the wafers 102 parallel to the housing base 206B.

In various embodiments, the wafer box 206, e.g. the housing of the wafer box 206, may include a plastics material, e.g. a thermoplastic, e.g. polypropylene, or can be formed therefrom. For example, it is possible to use materials which are typically used for producing wafer boxes.

In various embodiments, at least one base opening 228 can be formed in the housing base 206B. The at least one base opening 228 can be formed in such a way that at least one guide structure 222 can be received therein.

In various embodiments, the wafer box 206 and the wafer stacking aid 223 can be matched to one another, thus enabling them to interact in order to allow loading of the wafer box 206 with the wafers 102 arranged on the wafer carriers 204 (matched to the wafer box and the wafer stacking aid) without the wafer 102 underneath being damaged during the respective insertion or removal of one of the wafers 102 as a result of tilting of the inserted or removed wafer. For this purpose, the wafer box 206 can have at least as many base openings 228 as the stacking aid 223 has guide structures 222. For example, the wafer box 206 can have one base opening 228, and the wafer stacking aid 223 may have one guide structure 222, or the wafer box 206 can have two base openings 228 and the wafer stacking aid 223 two guide structures 222, or the wafer box 206 can have three base openings 228 and the wafer stacking aid 223 three guide structures 222, or the wafer box 206 can have any other suitable number N of base openings 228 and the wafer stacking 223 the same number N of guide structures 222. In various embodiments, the wafer box 206 can have more base openings 228 than the wafer stacking aid 223 has guide structures. For example, the wafer box 206 can have two or more base openings 228 and wafer stacking aid 223 one guide structure 222, or the wafer box 206 can have three or more base openings 228 and the wafer stacking aid 223 two guide structures 222, or the wafer box 206 can have four or more base openings 228 and the wafer stacking aid 223 three guide structures 222, or the wafer box 206 can have any other suitable number N of base openings 228 and the wafer stacking aid 223 a smaller number N-M, where 1≤M<N, of guide structures 222.

In various embodiments, if the at least one base opening 228 has a plurality of base openings 228, the base openings 228 can be arranged in such a way that, while one of the guide structures 222 is in one of the base openings 228, all the other guide structures 222 are each in one of the other base openings 228.

The at least one base opening 228 can be arranged in the housing base 206B in such a way that when the guide structure 222 (optionally a plurality of guide structures 222) is/are arranged in the base opening/s 228, it/they is/are situated outside a region in which the wafers 102 are to be arranged and instead is/are arranged in a region in which a rim region of the wafer carrier 204 is to be arranged.

Figure 2B:
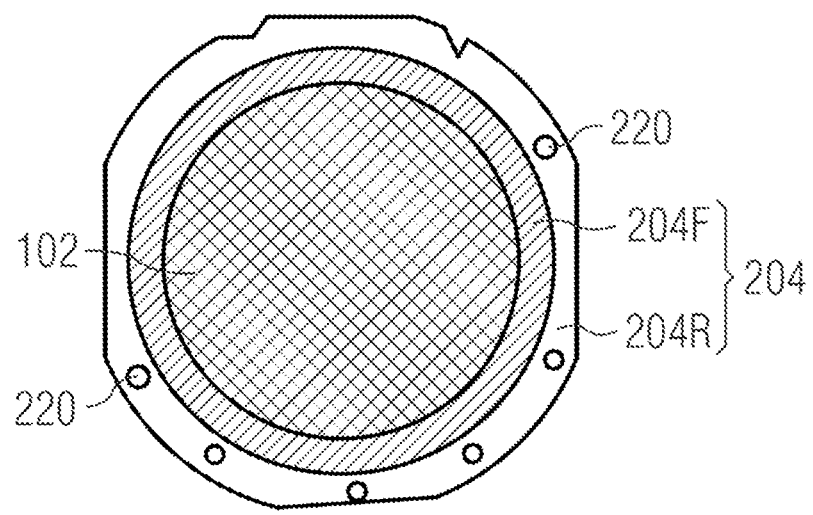
FIG. 2B shows a schematic plan view of a wafer carrier according to various embodiments with a wafer.

In various embodiments, it is possible, as illustrated in FIG. 2B in a schematic plan view of a wafer carrier 204 according to various embodiments, for the wafer carrier 204 to be similar to a conventional wafer frame but, as a departure from the conventional wafer frame, to have at least one guide opening 220. In FIG. 2B, the wafer carrier 204 has, by way of example, two guide openings 220 for two guide structures 222, for example, as illustrated in FIG. 2A and FIG. 2C.

In various embodiments, the wafer carrier 204 can have a frame part 204R and a surface part 204F. The surface part 204F can have a dicing tape, for example, on which the wafer 102 can be arranged for separation of the wafer 102 into individual chips. In various embodiments, the surface part 204F of the wafer carrier 204 can be flexible, e.g. elastic, e.g. if the surface part 204F has a dicing tape. In various embodiments, the frame part 204R can be rigid. The frame part 204R can be manufactured from plastic, for example, e.g. injection molded, or may include a plastic. The plastic can, for example, be or include a thermoplastic, e.g. polypropylene. In various embodiments, the frame part can be manufactured from metal.

In various embodiments, the wafer carrier 204 can be configured differently than the wafer carrier 204 in FIG. 2 inasmuch as it allows the arrangement of the plurality of wafers 102 in the receiving space 206A with their main surfaces parallel to the housing base 206B and the limitation of the tilting of a wafer 102 during movement (raising and/or lowering) of the wafer 102 in the receiving space 206A. For example, the wafer carrier 204 can be manufactured completely from rigid plastic and/or metal. In this connection, see also the wafer carriers described in conjunction with FIG. 9A to FIG. 10B and FIG. 11C to FIG. 12.

In various embodiments, a wafer carrier 204 which is formed partially or completely from metal can allow a thinner configuration than a wafer carrier made of plastic with a comparable stability. In contrast, a wafer carrier 204 which is manufactured partially or completely from plastic may be less expensive to produce than a wafer carrier in which at least one (further) part of the wafer carrier is formed from metal.

In various embodiments, the wafer 102 arranged on the wafer carrier 204 can be an undiced wafer 102. In various embodiments, the wafer 102 can be a diced wafer, e.g. a wafer 102 separated into individual chips (also referred to as dies).

In various embodiments, the wafer stacking aid 223 can have a base plate 224 and the at least one guide structure 222 extending out of the base plate 224.

In various embodiments, it can be possible to arrange the wafer stacking aid 223 below the wafer box 206 in such a way that, on the side of the housing base 206B on which the side walls 206S are arranged, the at least one guide structure 222 extends out of the housing base 206B of the wafer box 206 in order to limit tilting of the wafer 102 raised or lowered in the receiving space 206A in a manner guided by the guide structure 222.

Figure 4A:
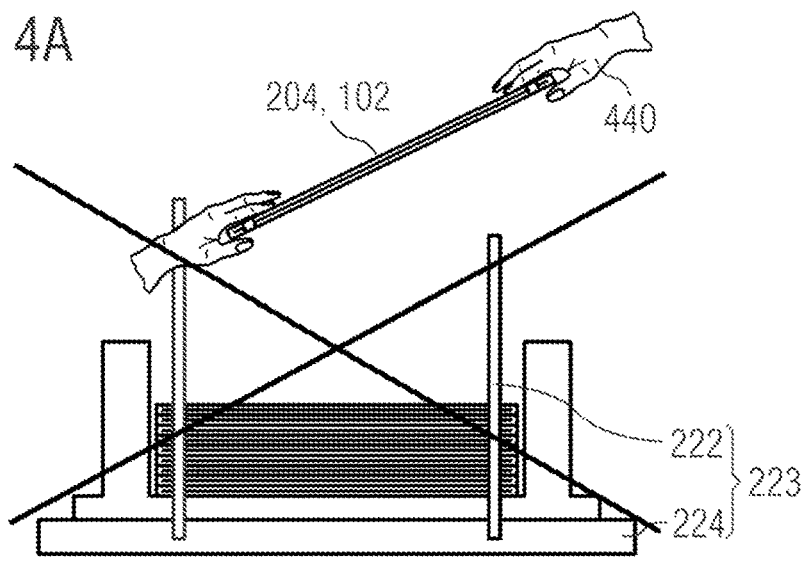
FIGS. 4A and 4B show each show a schematic cross-sectional view of various embodiments to illustrate limitation of tilting of a wafer to be arranged in a wafer box by means of a stacking aid.
Figure 4B:
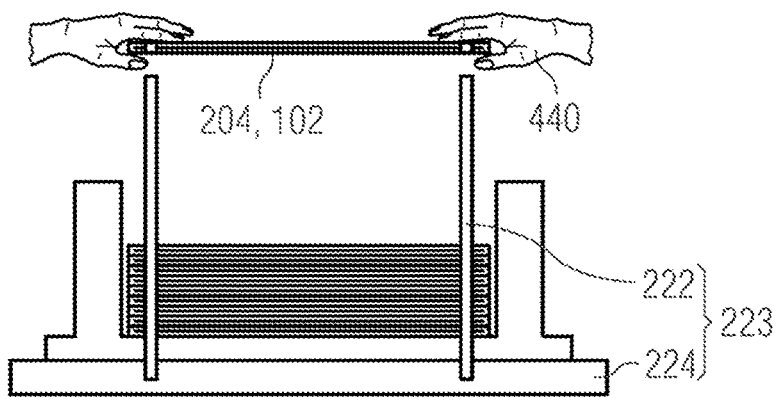

FIG. 2C illustrates a schematic cross-sectional view of a wafer box 206 with a stacking aid 223 and wafer carriers 204 with wafers 102 arranged thereon according to various embodiments in order to illustrate, together with FIG. 3, FIG. 4A and FIG. 4B, the interaction of the wafer box 206, the stacking aid 223 and the wafer carrier 204 to limit the tilting of the wafer 102 raised or lowered in the receiving space 206A in a manner guided by the guide structure 222.

If, as illustrated in FIG. 2C, the wafer box 206 at least partially filled with the wafers 102 arranged on wafer carriers 204 is moved in the direction of the arrow, the two guide structures 222 of the wafer stacking aid 223 can be inserted into the wafer box 206 through the base openings 228 to limit tilting of the wafer 102 raised or lowered in the receiving space 206A.

The at least one guide structure 222 can, for example, be formed as a web, rod, hollow cylinder or in any other shape which makes it possible to provide the functionality of the at least one guide structure 222, i.e. to guide the wafer 102 in such a way during movement in the receiving space 206A of the wafer box 206 that tilting of the wafer 102 or of the wafer carrier 204 on which it is arranged is limited to such an extent that damage of the wafer arranged underneath (i.e. between the moving wafer 102 and the housing base 206B) is avoided. To allow guidance, each of the wafer carriers 204 can have the at least one guide opening 220, into which the at least one guide structure 222 can be insertable.

In various embodiments, it is possible, as illustrated in FIG. 2C, for the base openings 228 and the guide openings 220 each to be arranged in alignment, thus allowing the guide structures 222 to be inserted into the wafer box 206 through the base openings 228 and the guide openings 220 arranged thereabove.

FIG. 3 shows, in a schematic cross-sectional view, a state which can be achieved after the assembly of the wafer box and the stacking aid from FIG. 2C according to various embodiments. The guide structures 222 can be inserted into the guide openings 220 of the wafer carriers 204. In various embodiments, the guide structures 222 can extend through the stack of wafer carriers 102. In various embodiments, the guide structures 222 can extend out of the receiving space 206A, as illustrated in FIG. 3.

In various embodiments, the at least one guide structure 222 can be arranged in such a way that it extends within the receiving space 206A into the wafer box 206 or through the latter. In this case, the at least one guide structure 222 can be arranged in such a way that it extends through a rim of the wafer carrier 204, e.g. through a region between an outer edge of the wafer 102 arranged on the wafer carrier 204 and an outer edge of the wafer carrier 204.

In various embodiments, if the guiding aid 223 has the plurality of guide structures 222, the guide structures 222 can be distributed uniformly over the circumference of the base plate 206B. In other words, the plurality of guide structures 222 can be arranged at uniform angular intervals with respect to one another. For example, two guide structures 222 can be arranged opposite one another, which can correspond to an angular interval of 180° between them (see FIG. 2A), three guide structures 222 can be arranged as though they were located at tips of an equilateral triangle, which can correspond to an angular interval of in each case 120° between adjacent guide structures 222, four guide structures 222 can be arranged as though they were located at tips of a square, which can correspond to an angular interval of in each case 90° between adjacent guide structures 222 etc.

In various embodiments, the plurality of base openings 228 can be arranged mutatis mutandis in exactly the same way as the plurality of guide structures 222, that is to say, for example, in a manner distributed uniformly over a circumference of the container base 206B, e.g. at uniform angular intervals with respect to one another, e.g. at angular intervals of 180° in the case of two base openings 228, 120° in the case of three base openings 228, and 90° in the case of four base openings 228 etc.

In various embodiments, the plurality of guide openings 220 can be arranged mutatis mutandis in exactly the same way as the plurality of guide structures 222 or the plurality of base openings 228, that is to say, for example, in a manner distributed uniformly over a circumference of the wafer carrier 204, e.g. at uniform angular intervals with respect to one another, e.g. at angular intervals of 180° in the case of two guide openings 220 (see FIG. 2B), 120° in the case of three guide openings 220, and 90° in the case of four guide openings 220 etc.

In various embodiments, the plurality of base openings 228 can be distributed nonuniformly over the circumference of the base plate 206B. The plurality of guide structures 222 and the plurality of guide openings 220 can then be arranged in corresponding fashion, with the result that the plurality of guide structures 222 can be arranged in the plurality of base openings 228 and the plurality of guide openings 220. By means of the nonuniform distribution, it is possible to limit a number of possible (angular) positions of the wafers 102 in the wafer box 206, e.g. in such a way that only a single angular position can be adopted by the wafer 102 arranged on the wafer carrier 204.

In various embodiments, the at least one guide structure 222, when arranged in the at least one base opening 228, can be at a distance of at least 2 mm from further structures of the wafer box 206 which extend from the housing base 206B and from a wafer region in which the wafers 102 are to be arranged. This ensures that the at least one guide opening 220 can be situated completely within an area of the wafer carrier 204, e.g. of the rim 204R of the wafer carrier 204, and can thus be arranged in a reliably guided manner and with little play relative to the at least one guide structure 222 in any direction.

In various embodiments, a height to which the at least one guide structure 222 extends above an upper side of the housing base 206B, i.e. above a side of the housing base 206B which faces the receiving space 206A, can be referred to as a guiding height 222H. The guiding height 222H can be greater than about two times the thickness of the wafer frame, i.e. greater than about 2 mm. The guiding height 222H can be in a range of from about two times the thickness of the wafer frame to a sum of the side wall height of the wafer box and half the width of the wafer frame, e.g. from about 1 cm to about 1 m, e.g. from about 2 cm to about 50 cm, e.g. from about 5 cm to about 25 cm.

In various embodiments, the at least one guide structure 222 can have a length substantially parallel to or along an edge (e.g. an outer rim) of the wafer carrier which can be in a range of from about 5 mm to about half the circumference of a wafer carrier, e.g. in a range of from about 5 mm to about 10 cm, e.g. from about 1 cm to about 3 cm.

In various embodiments, the at least one guide structure 222 can have a width perpendicular to the length which can be in a range of from about 5 mm to about 3 cm, e.g. in a range of from about 5 mm to about 2 cm, e.g. about 1 cm.

In various embodiments, the at least one guide structure 222 can, for example, have at least one rod of circular cross section which has a diameter of about 5 mm to about 12 mm, e.g. a diameter of about 1 cm.

In various embodiments, the at least one guide structure 222 may include a metal or can be formed therefrom, e.g. a non-corroding metal. In various embodiments, the at least one guide structure 222 may include a plastic, e.g. a thermoplastic, e.g. polypropylene, or any other suitable material which is sufficiently rigid, stress-resistant and smooth to allow the guidance of the plurality of wafers 102. In various embodiments, the at least one guide structure 222 can be injection molded. In various embodiments, the at least one guide structure 222 can be formed integrally with the base plate 224. In various embodiments, the at least one guide structure 222 can be connected detachably to the base plate 224, e.g. being screwed on or in, inserted or the like. The at least one guide structure 222 can extend substantially perpendicularly to the base plate 224, for example.

In various embodiments, the at least one guide structure 222 can be of conical design at the tip thereof, i.e. at the free end thereof facing away from the base plate 224 or the container base 206B. This allows insertion of the at least one guide structure 222 into the at least one guide opening 220 to be easier or to be made easier.

In various embodiments, the base plate 224 can be of flat configuration. In various embodiments the base plate 224 can be provided for substantially horizontal arrangement on a horizontal support, i.e. with the main surfaces thereof substantially parallel to the horizontal support. In various embodiments, the main surfaces of the base plate 224 can be shaped in such a way that the housing base 206B is at least congruent with the base plate 224. This enables the wafer box 206 to stand securely. In various embodiments, the base plate 224 can be made larger in one or more directions than the housing base 206. In other words, the base plates 224 can end substantially or completely at the housing base 206B over the entire circumference of said housing base, can project beyond said housing base, or can end at said housing base at some locations and project beyond it at other locations.

In various embodiments, the base plate 224 may include a plastic, e.g. a thermoplastic, e.g. polypropylene. In various embodiments, the base plate 224 may include a metal or be formed therefrom, e.g. a non-corroding metal. Alternatively or in addition, the base plate 224 may include any other suitable material.

In various embodiments, the wafer 102 arranged on the wafer frame 204 can be guided by the at least one guide structure 222 (in this case: two guide structures 222) during a movement in the direction of the arrow in FIG. 3, i.e. during a movement upward away from the housing base 206B within the receiving space 206A. In this case, the wafer 102 can be moved along the guide structure/s 222 on the wafer carrier 204. In corresponding fashion, the wafer 102 arranged on the wafer frame 204 can be guided by the at least one guide structure 222 (in this case: two guide structures 222) during a movement counter to the direction of the arrow in FIG. 3, i.e. during a movement downward toward the housing base 206B within the receiving space 206A. In this case, the wafer 102 can be moved along the guide structure/s 222 on the wafer carrier 204.

In various embodiments, the wafer carriers 204 and the guide structures 222 can be formed and matched to one another in such a way that play, i.e. freedom of movement required for use, within which the wafer carrier 204 can be moved freely relative to the guide structure 222, between the at least one guide structure or each of the guide structures 222 and the respective guide opening 220 in which the guide structure 222 is arranged is small enough to limit the tilting of the moved wafer carrier 204 with the wafer 102 to such an extent that damage to the wafer 102 underneath is avoided. To ensure that the play is small enough, a mean clearance between an outer surface of the guide structure 222 and an inner edge of the guide opening 220 into which the guide structure 222 can be inserted is at most about 1 cm with the guide structure 222 inserted, e.g. at most about 5 mm, e.g. at most 2 mm, e.g. at most 1 mm or less.

FIG. 4A and FIG. 4B each show a schematic cross-sectional view of various embodiments intended to illustrate the limitation of tilting of the wafer 102 to be arranged in the wafer box 206 by means of the stacking aid 223.

Tilting of the wafer 102 should be taken to mean that the wafer 102 (mounted on the wafer carrier 204, e.g. by means of an adhesive) can be arranged at an angle to the other wafers 102 in the receiving space 206A or to the housing base 206B. Here, one point on an edge of the wafer carrier 204 can be closer to the wafer 102 underneath than an opposite point of the wafer carrier 204 to the first point.

As is illustrated in FIG. 4A in conjunction with FIG. 4B, a (e.g. severely) tilted wafer 102 cannot be stacked, e.g. by hand 440, in the receiving space 206A of the wafer box 206. Here, severe tilting may mean that the wafer 102 is tilted to such an extent that the tilted wafer 102 could damage the wafer 102 underneath, e.g. could scrape across a surface of the wafer 102 underneath with its edge facing the wafer 102 underneath.

In various embodiments, a wafer box 206 and a wafer carrier 204, e.g. a wafer frame, can be provided with guide openings 220, e.g. holes 220, for insertion into a special guiding tool (the wafer stacking aid 223). For example, the guiding tool 223 can have two guide structures 222 of equal height (i.e. two guide structures 222 with the same guiding height 222H), e.g. webs or rods, which can prevent the wafer 102 being tilted at an angle in critical proximity to the wafer 102 underneath.

As is illustrated in FIG. 4B, the fact that the removal of the wafer (to be understood here as complete release of the wafer 102 from the wafer box 204 and the wafer stacking aid 223) can take place above the guide structures 222, i.e. above the webs 222, tilting of the wafer 102 at an angle into critical regions of the wafer 102 underneath can be made more difficult or impossible.

Figure 4C:
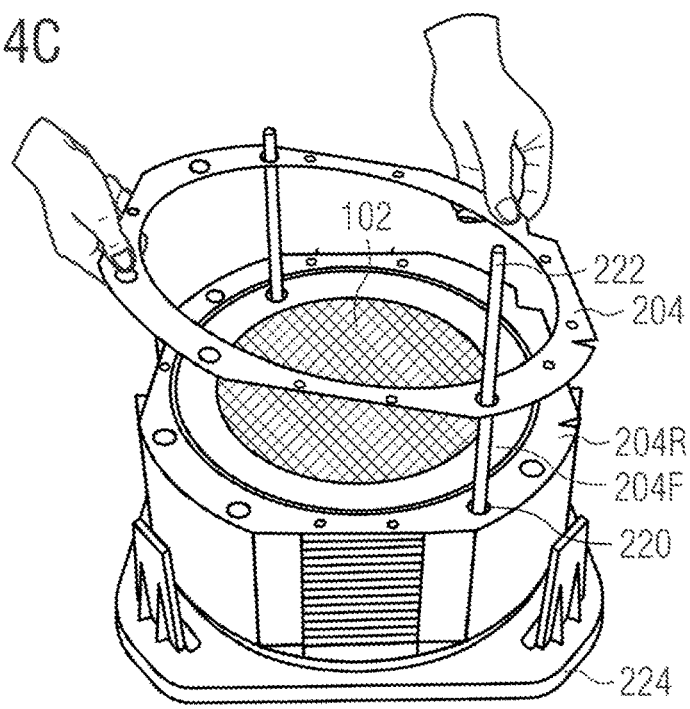
FIG. 4C shows a perspective view of a wafer box with a stacking aid and wafer carriers according to various embodiments.

In a perspective view of a wafer box 206 with a stacking aid 223 and wafer carriers 204 according to various embodiments, FIG. 4C shows a wafer carrier 204 (to better illustrate it without the wafer 102) during insertion into the wafer box 206 or during removal from the wafer box 206. In the view, the wafer carrier 204 is moved into a position in which the wafer carrier 204 adopts a maximum possible tilt as it is guided by the guide structures 222. As can be seen from the figure, both a position and an angle of the wafer carrier 204 with the wafer 102 are limited in such a way by means of the guide structures 222 and the corresponding guide openings 220 that the moved wafer carrier 204 cannot come into contact with the surface of the wafer 102 underneath, i.e. cannot damage the latter. At most, contact with the wafer carrier 204 underneath is possible, wherein the wafer carrier 204 can be configured in such a way that it is not damaged by such contact.

In various embodiments, the stacking aid 223 can be separated from the wafer box 206, with guidance by the at least one guide structure 222, after the arrangement of the plurality of wafers 102, in order, for example, to supply the wafer box 206 filled with wafers 102 to a recipient. For example, the stacking aid 223 can be separated from the wafer box 206 if the at least one guide structure 222 has a guiding height 222H which is significantly greater than the height of the side wall 206S of the wafer box 206, e.g. one or more centimeters greater. In a case where the recipient already has a suitable stacking aid 223, e.g. from a previous delivery, it may also be superfluous to leave the stacking aid 223 on or in the wafer box 206, for example. In various embodiments, e.g. when using a high quality stacking aid 223, e.g. a stacking aid made of metal or the like.

In various embodiments, the stacking aid 223 can remain on the wafer box 206 after the arrangement of the plurality of wafers 102, with guidance by the at least one guide structure 222, in order, for example, to supply the wafer box 206 filled with wafers 102 to the recipient together with the stacking aid 223. For example, the stacking aid 223 can remain on the wafer box 206 if the at least one guide structure 222 has a guiding height 222H which is no greater or only slightly greater than the height of the side wall 206S of the wafer box 206, resulting in an at most insignificant increase in a volume of the object dispatched due to the stacking aid 223.

In various embodiments, the wafer box 206 and the stacking aid 223 can form a wafer transport system. In this case, the wafer box 206 and the wafer stacking aid 223 can be matched to one another as described above.

In various embodiments, the wafer transport system can be supplemented by a wafer carrier 204 according to various embodiments. The wafer carrier 204 can be matched as described above to the wafer box 206 and the wafer stacking aid 223.

In various embodiments, damage to a wafer 102 situated underneath a wafer 102 which is being inserted into the wafer box or removed therefrom can be prevented by means of the wafer transport system.

Figure 5A:
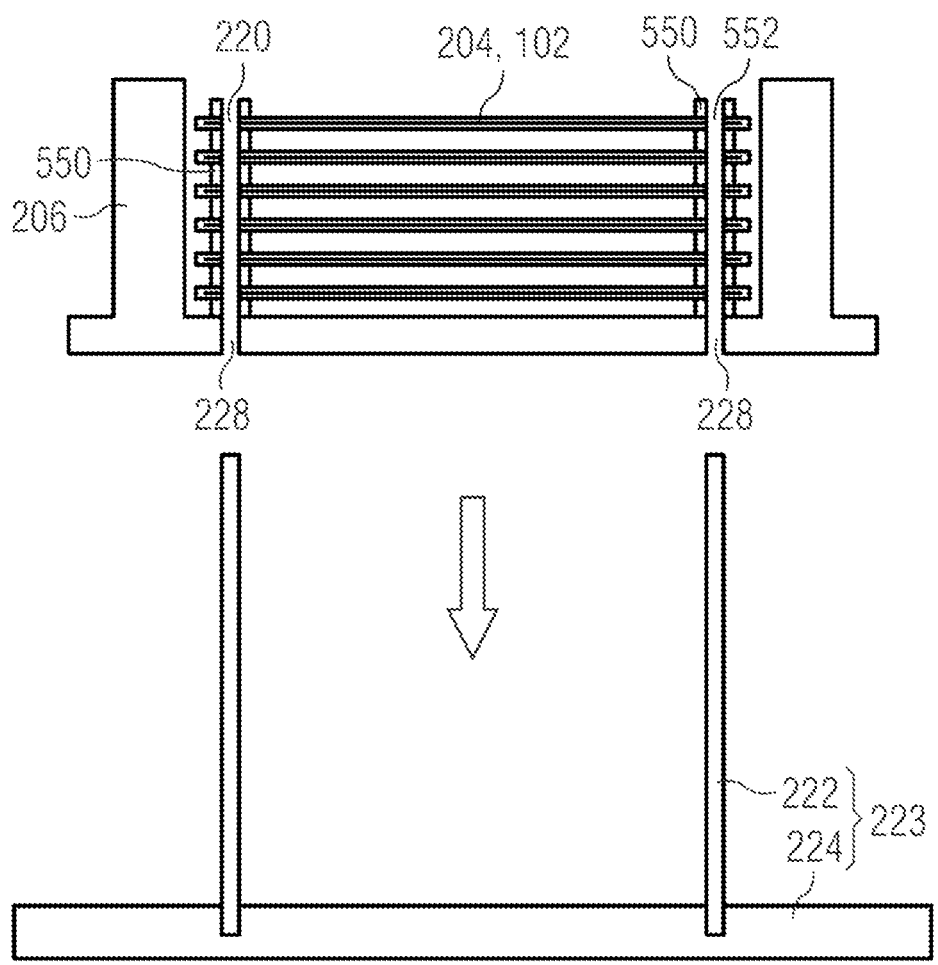
FIGS. 5A and 5B show each show a schematic cross-sectional view of various embodiments to illustrate the assembly of a wafer box with wafers and a stacking aid.
Figure 5B:
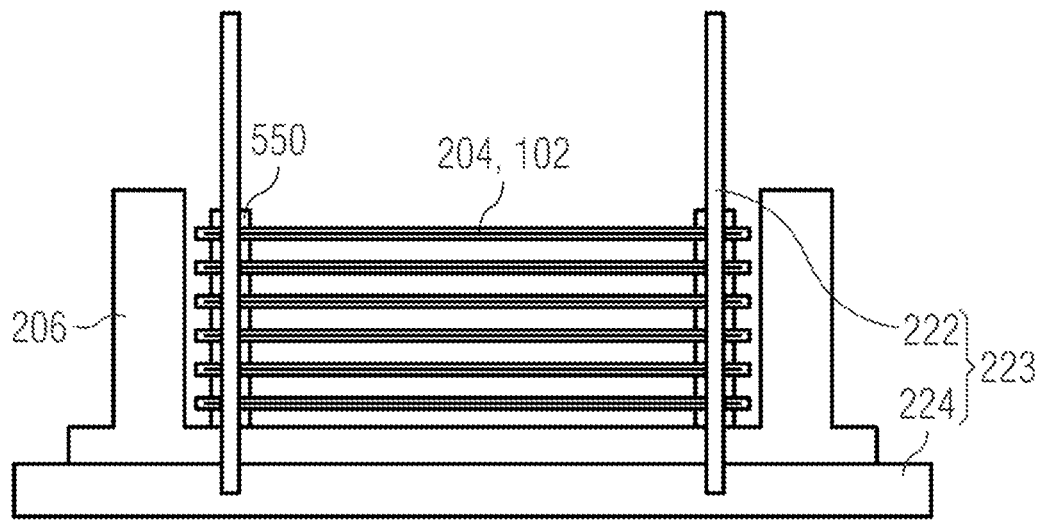

FIG. 5A and FIG. 5B each show a schematic cross-sectional view of various embodiments of a wafer box 206 with wafers 102 arranged on wafer carriers 204 and a stacking aid 223 to illustrate assembly of the wafer box 206, in which the plurality of stacked wafers 102 arranged on wafer carriers 204 is situated, with the stacking aid 223.

Figure 6A:
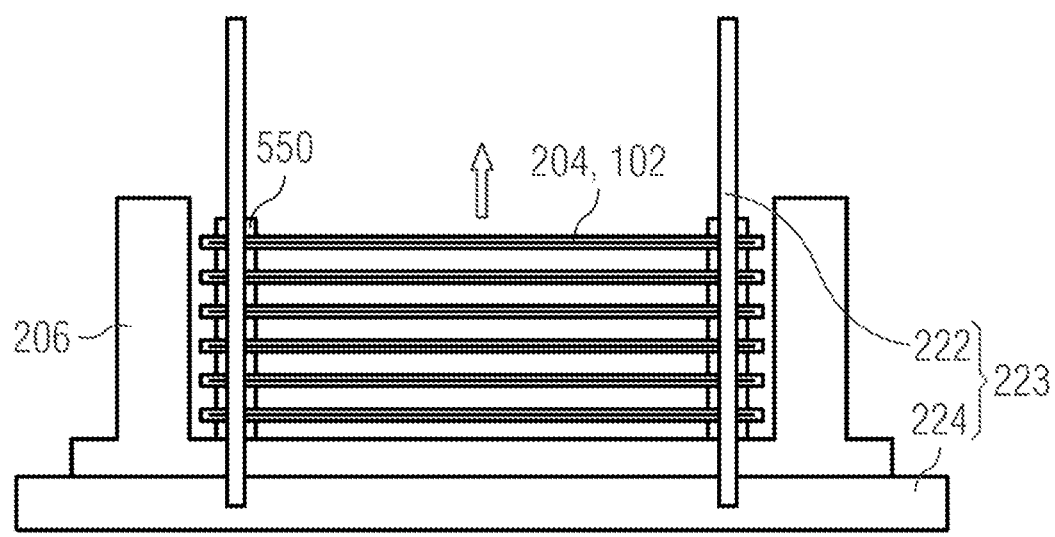
FIGS. 6A and 6B show each show a schematic cross-sectional view to illustrate removal of a wafer from a wafer box by means of a stacking aid according to various embodiments.
Figure 6B:
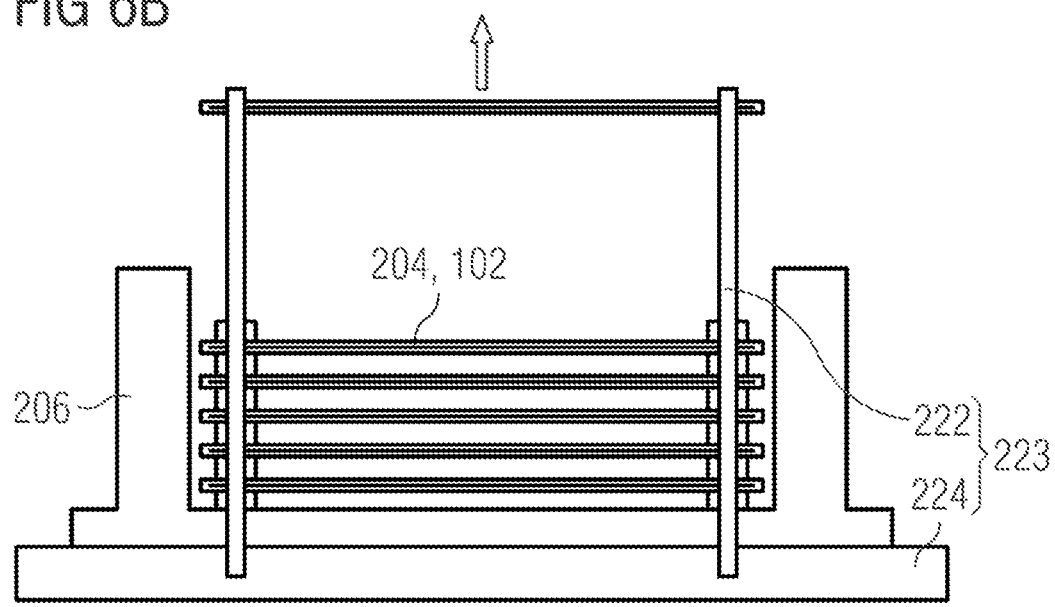
Figure 7A:
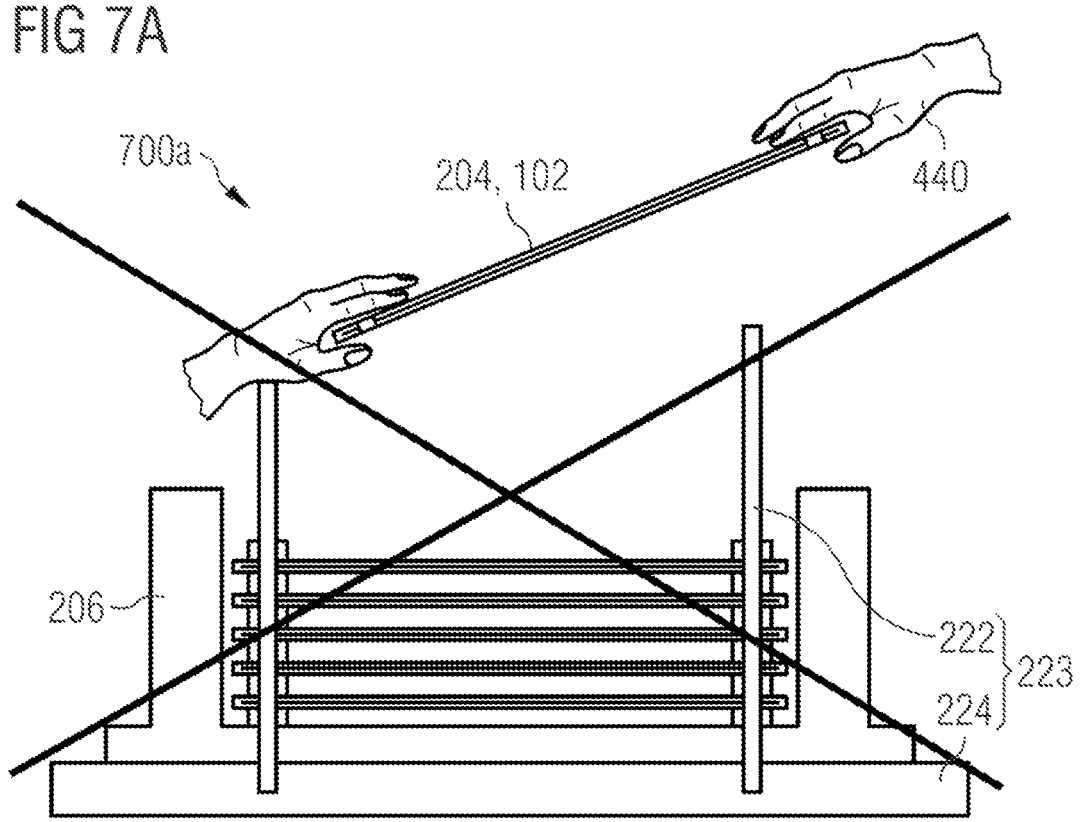
FIGS. 7A and 7B show each show a schematic cross-sectional view of various embodiments to illustrate limitation of tilting of a wafer to be arranged in a wafer box by means of a stacking aid.
Figure 7B:
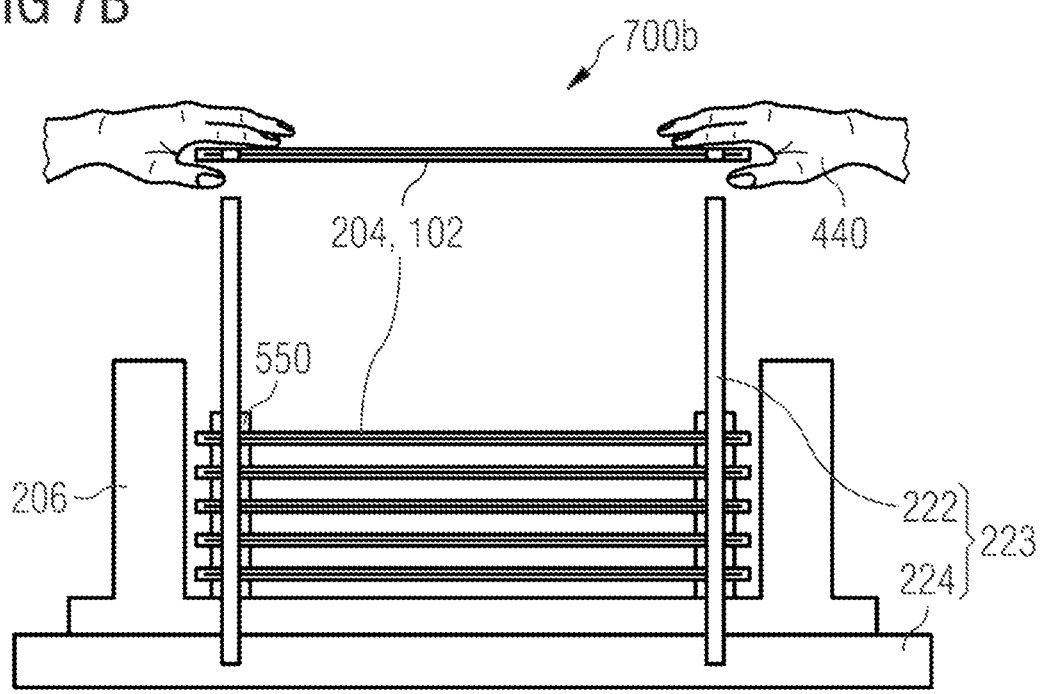

FIG. 6A and FIG. 6B each show a schematic cross-sectional view of the wafer box 206, of the wafers 102 arranged on wafer carriers 204 and of the stacking aid 223 from FIG. 5A and FIG. 5B to illustrate removal of a wafer 102 from the wafer box 206 by means of the stacking aid 223 according to various embodiments. FIG. 7A and FIG. 7B each show a schematic cross-sectional view of the wafer box 206, of the wafers 102 arranged on wafer carriers 204 and of the stacking aid 223 from FIG. 5A, FIG. 5B, FIG. 6A and FIG. 6B to illustrate limitation of tilting of the wafer 102 to be arranged in the wafer box 206 by means of the stacking aid 223.

The embodiments in FIG. 5A to FIG. 7B, e.g. the wafer box 206, the wafer carriers 204 and the wafer stacking aid 223, can correspond substantially to those which have been described above in conjunction with FIG. 2A to FIG. 4C.

In contrast to the embodiments described above, however, spacers 550 can be arranged between each pair of wafer carriers 204 with wafers 102 arranged thereon. In various embodiments, the spacers 550 can be positioned by means of the guide structures 222. For this purpose, the spacers can each have a positioning opening 552.

In various embodiments, positioning by means of the guide structures 222 allows the spacers 550 to be made small and of simple configuration, e.g. as respective sleeves surrounding one of the guide structures 222. The spacers 550 which are provided for positioning around the individual guide structures 222 can be formed with a mutually identical shape. In other words, the spacers 550 can be formed in such a way that each spacer 550 can be arranged around each of the guide structures 222.

In order to achieve a uniform vertical spacing (i.e. perpendicularly to the main surface) over the entire main surface of the stacked wafers 102, it is possible in various embodiments for at least three spacers 550 to be positioned between two wafers 102. Accordingly, at least three guide structures 222 can be provided.

In various embodiments, the spacers 550 can be used if the wafers 102 protrude from a plane defined by the main surfaces of the wafer carriers 204, e.g. wafer frames, with the result that the wafers 102 could come into contact with the respective wafer carriers 204 situated thereabove during stacking of the wafers 102 arranged on the wafer carriers 204. This could occur, for example, when using thin metal wafer frames as wafer carriers 204 and/or, for example, in the case of thick wafers 102, e.g. wafers with high top-surface structures, e.g. micromechanical components and the like.

FIG. 5A shows the connection of the wafer box 206 according to various embodiments, said wafer box being filled with a stack of wafers 102 arranged on wafer carriers 204 and spaced apart by spacers 550, to the wafer stacking aid 223 according to various embodiments, which can lead to the arrangement illustrated in FIG. 5B.

FIG. 6B and FIG. 6C illustrate the removal of the wafers arranged on the wafer carriers 204 in a manner guided by the guide structures 222. After the removal of each one of the wafers 102, the spacers 550 can be removed, being guided in each case by the guide structure for example, and then the next wafer 102 can be removed.

FIG. 7A and FIG. 7B, like FIG. 4A and FIG. 4B for the embodiment without the spacers, illustrate the limitation of tilting of the wafer 102 or of the wafer carrier 204 by means of the guide structures 222.

Figure 8A:
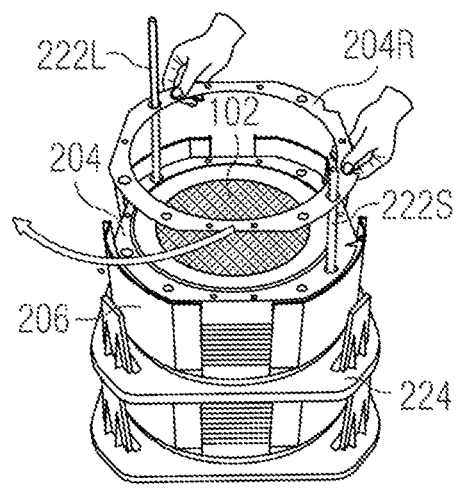
FIGS. 8A and 8B show each show a perspective view of a wafer box with a stacking aid and wafer carriers according to various embodiments to illustrate removal of a wafer from the wafer box.
Figure 8B:
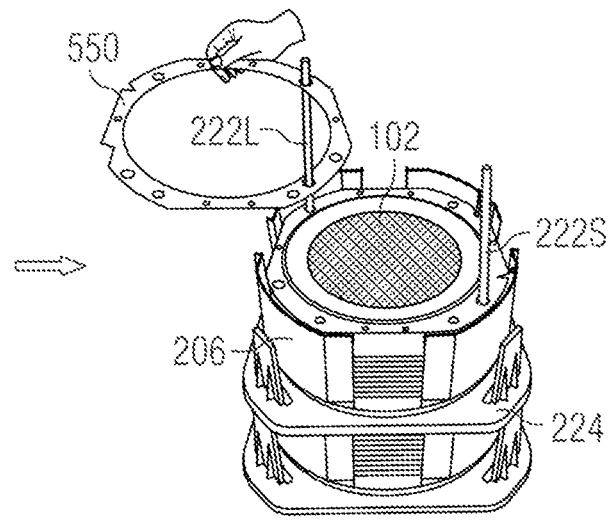
Figure 8C:
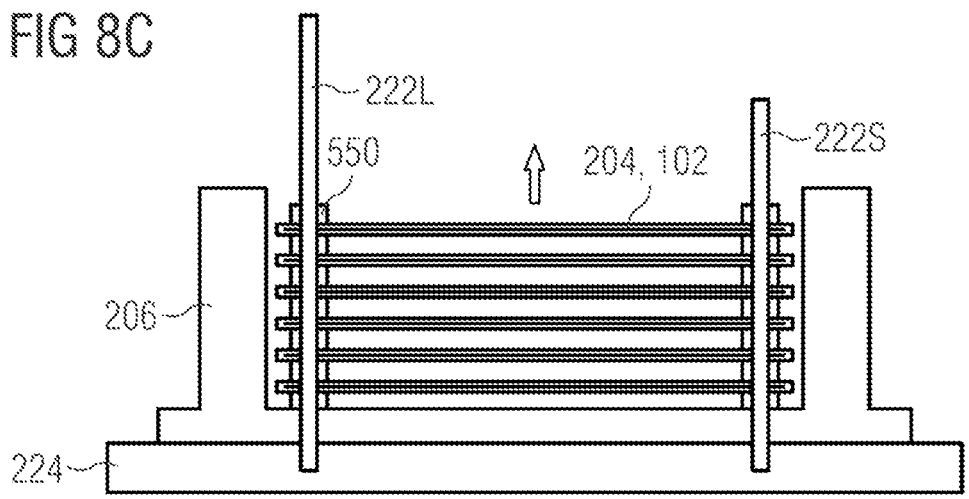
Figure 8D:
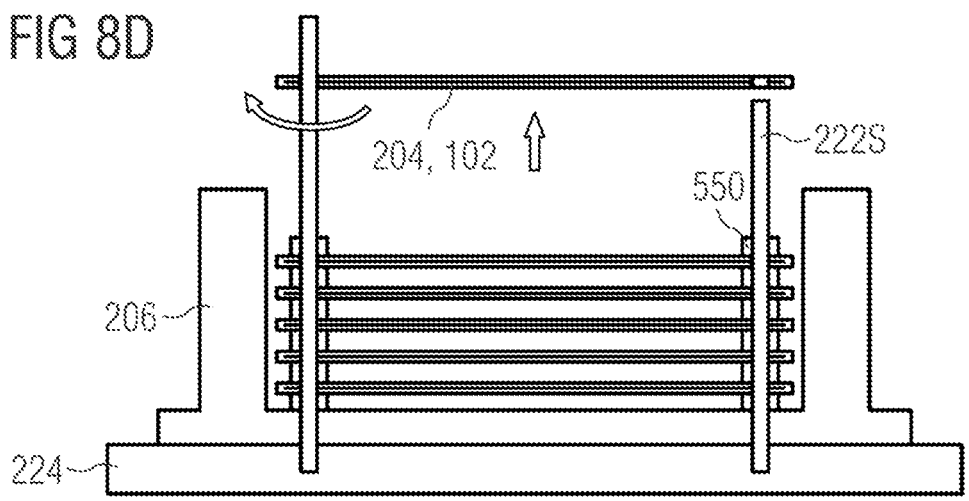

FIG. 8A and FIG. 8B each show a perspective view of a wafer box 206 with a wafer stacking aid 223 and wafer carriers 204 with wafers 102 arranged thereon according to various embodiments to illustrate removal of one of the wafers 102 from the wafer box 206. FIG. 8C to FIG. 8F each show a schematic cross-sectional view to illustrate removal of the wafer 102 from the wafer box 206 by means of the stacking aid 223 according to various embodiments.

The embodiments illustrated in FIG. 8A to FIG. 8F, e.g. the wafer box 206, the stacking aid 223, the wafer carriers 204 etc., can correspond substantially to the embodiments described above, e.g. in respect of functionality, materials, dimensions etc.

In contrast to or in addition to the embodiments described above, the stacking aid 223 can have two guide structures 222 of different heights. In other words, the height 222H (see FIG. 3) of one of the guide structures 222L can be greater than the height 222H of the at least one further guide structure 222S. In this case, at least the higher guide structure 222L (or even both guide structures in FIG. 8A to FIG. 8F) can protrude from the receiving opening 206A of the wafer box 206. At least the higher guide structure 222L and, optionally, e.g. when using spacers 550 such as those illustrated in FIG. 8C to FIG. 8F, a plurality or all of the guide structures 222, can have a round cross section.

In various embodiments, it is thereby possible, after raising the wafer carrier 204 out of the receiving space 206A of the housing of the wafer box 206 in a manner guided by the guide structures 222, to enable the wafer carrier 204 with the wafers 102 arranged thereon to be pivoted horizontally about the higher guide structure 222L as an axis until the wafer box 206 is substantially no longer underneath the pivoted wafer 102. In this position, the wafer carrier 204 with the wafer 102 according to various embodiments can be removed, i.e. completely released from the guide structures 222L.

Conversely, loading of the wafer box 206 with the wafers 102 arranged on the wafer carriers 204 can, according to various embodiments, be carried out in such a way that the higher guide structure 222L is first of all inserted into a (optionally defined) guide opening 220 of one of the wafer carriers 204 with the wafer 102 arranged thereon, wherein the wafer carrier 204 is in a position in which none of the other wafers 102 is underneath the wafer 102 to be inserted into the wafer box 206. The wafer carrier 204 with the wafer 102 can then be pivoted horizontally about the higher guide structure 222L as an axis until it is above the wafer box 206 in such a way that, guided by the higher guide structure 222L and, as it is lowered further, additionally by the at least one further, shorter guide structure 222S, it can be lowered into the wafer box 206.

By virtue of the fact that the removal of the wafer 102 or the arrangement of the guide structure 222S in the guide opening 220 of the wafer carrier 204 for loading the wafer box can take place in a position in which the wafer 102 is not above the other wafers 102 in the stack, a risk of damage to the wafers 102 originally arranged underneath the wafer 102 to be removed can be further reduced.

Even if an embodiment with spacers is illustrated in FIG. 8C to FIG. 8F, the guide structures 222L, 222S of different lengths can also be used in the embodiments without spacers 550, e.g. similar to the embodiments described in conjunction with FIG. 2A to FIG. 4B.

As has already been explained in the embodiments described in conjunction with FIG. 2A to FIG. 4B, it is furthermore possible in various embodiments to dispense with the short guide structure 222S and to provide only the higher guide structure 222L in order to be able to pivot the wafer carrier 204 horizontally about the guide structure 222L when loading and unloading the wafer box 206 with wafers 102.

Figure 9A:
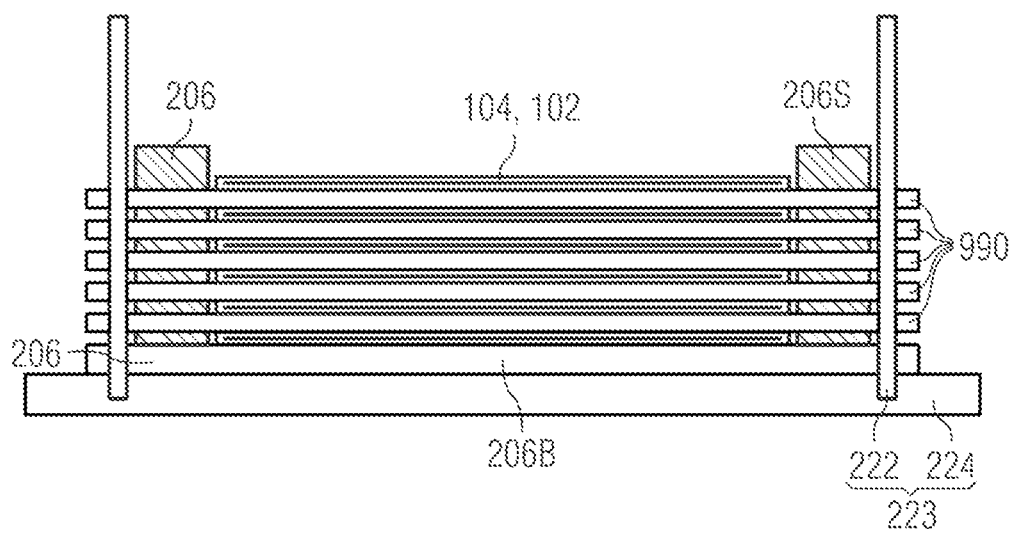
FIGS. 9A to 9C each show a schematic cross-sectional view to illustrate removal of a wafer from a wafer box by means of a stacking aid according to various embodiments.
Figure 9B:
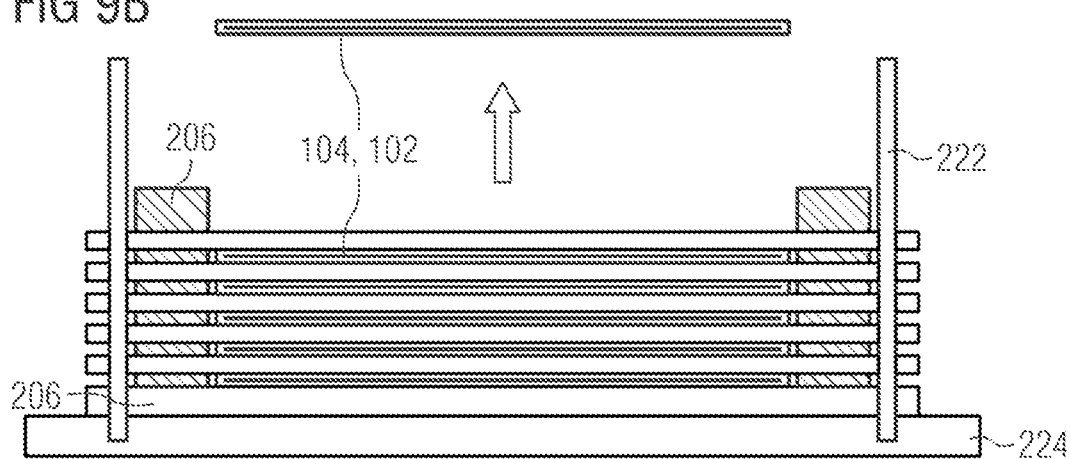
Figure 9C:
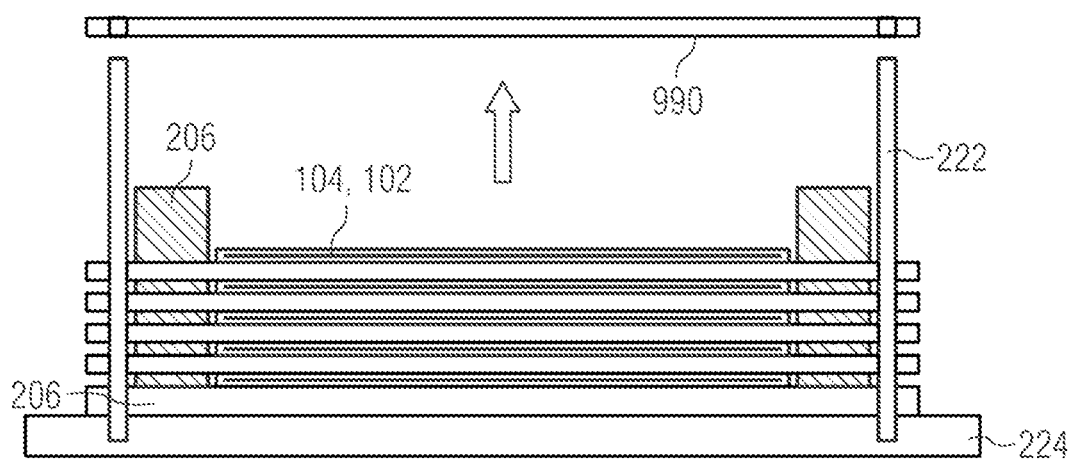

FIG. 9A to FIG. 9C each show a schematic cross-sectional view intended to illustrate removal of a wafer 102 arranged on a wafer carrier 990 from a wafer box 206 by means of a stacking aid 223 according to various embodiments.

The embodiments illustrated in FIG. 9A to FIG. 9C, e.g. the wafer box 206, the stacking aid 223, the wafer carriers 204 etc., can correspond substantially to the embodiments described above, e.g. in respect of functionality, materials, dimensions etc.

Figure 12:
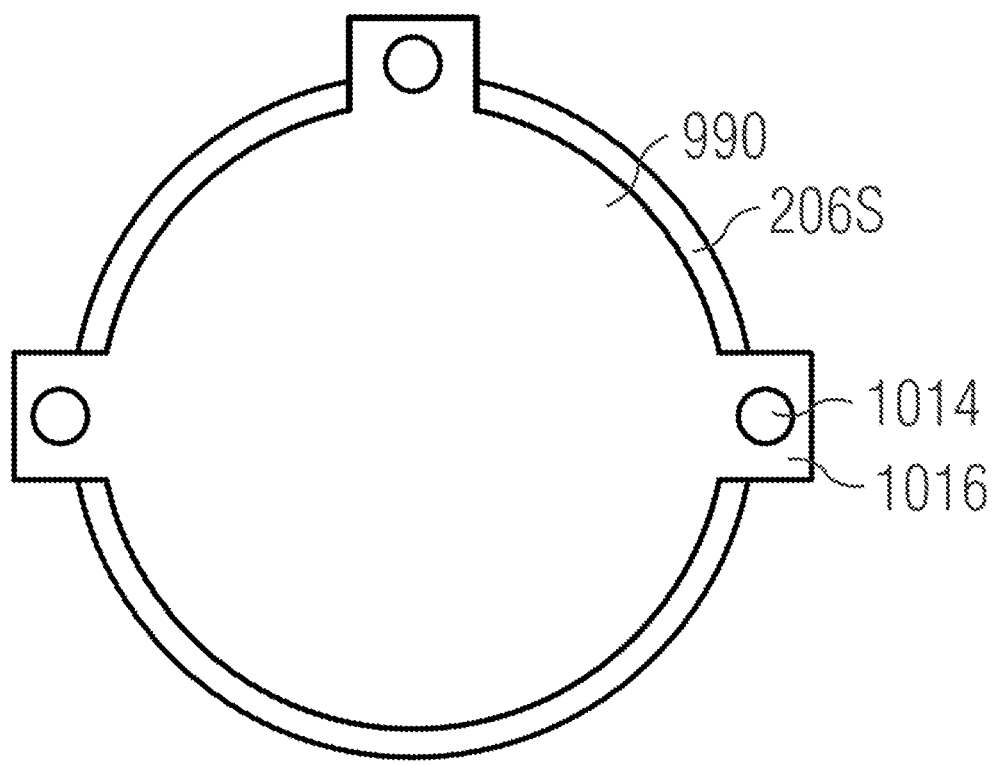
FIG. 12 shows a schematic plan view of a wafer carrier according to various embodiments.

In contrast to or in addition to the embodiments described above, wafer carrier 990 can be configured in such a way that, unlike wafer carrier 204, the external dimensions of which can correspond substantially to a conventional wafer frame, it extends at least partially horizontally, i.e. in a plane of wafer carrier 990, beyond the receiving space 206A. This is illustrated in FIG. 12, which shows a schematic plan view of wafer carrier 990 according to various embodiments. At least one projection 1016 (by way of example three projections 1016 in FIG. 12) can extend beyond the side wall 206S of the wafer box 206. The side wall 206S can be interrupted at points at which the at least one projection 1016 is to be arranged. The side wall 206S can be absent there, for example. The side wall 206S is therefore shown hatched in FIG. 9A to FIG. 9C in order to illustrate that it would not actually be visible in cross section.

In the at least one projection 1016 it is possible to form a respective guide opening 1016, in which a respective guide structure 222 can be arranged, e.g. the guide structure 222 of a wafer stacking aid 223.

In contrast to the embodiments described above, the at least one guide structure 222 for guiding wafer carrier 990 can thus be arranged outside the receiving space 206A. Accordingly, at least one base opening 228 (not shown in FIG. 9A to FIG. 9C but see FIG. 10A, for example) can be arranged in a part of a housing base 206B of the wafer box 206 which is not situated underneath the receiving space 206A.

It is thereby possible in various embodiments to enable wafers 102 arranged on conventional (unperforated) wafer frames 104 to be arranged on wafer carriers 990 and to protect them from damage, e.g. caused by scratching due to tilting of the wafer carrier, during loading of the wafer box 206 and removal of the wafers from the wafer box 206 by means of the wafer carriers 990 guided by the at least one guide structure 222.

Wafer carriers 990 can come into contact with the wafer frames 104 in various embodiments, as illustrated in FIG. 9A to FIG. 9C.

Figure 11A:
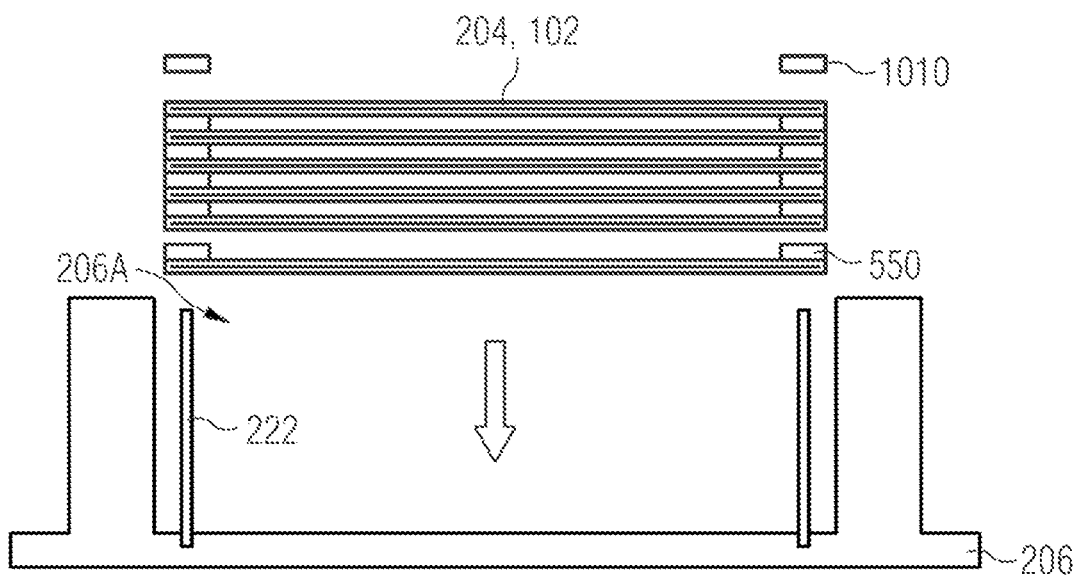
FIGS. 11A and 11B each show a schematic cross-sectional view of various embodiments to illustrate assembly of a wafer box with wafers.
Figure 11B:
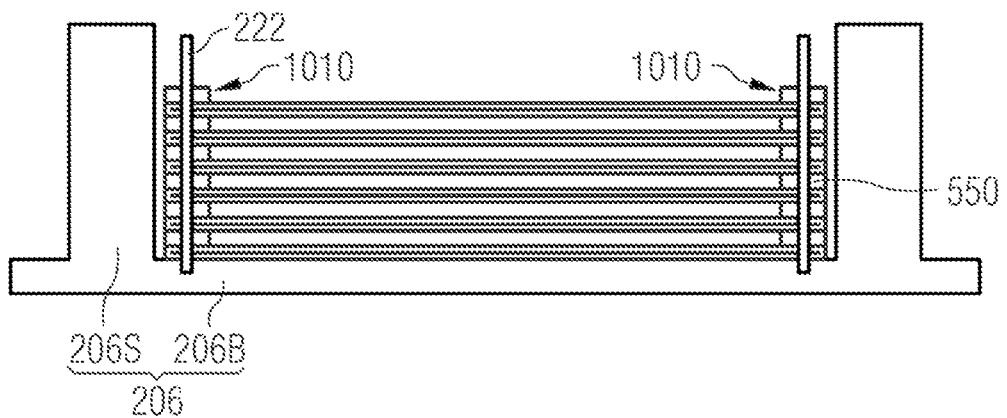
Figure 11C:
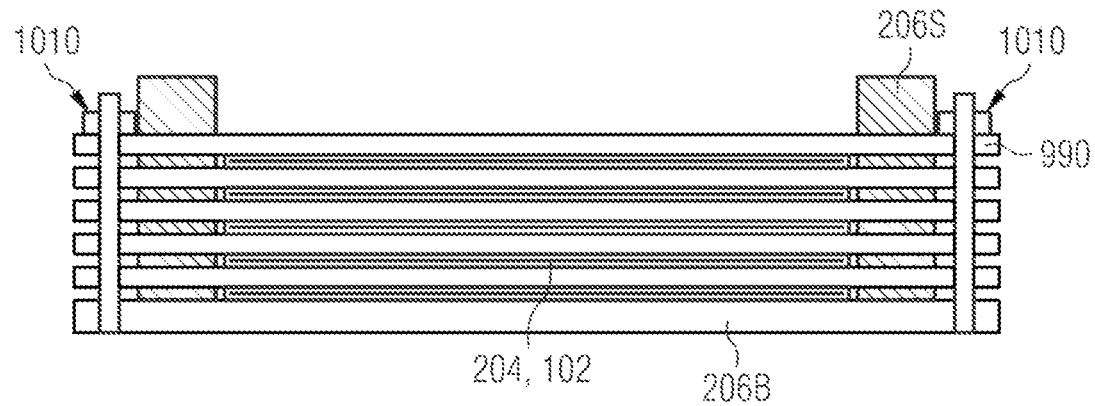
FIGS. 11C to 11F each show a schematic cross-sectional view of a wafer box with a stacking aid and wafer carriers according to various embodiments.
Figure 11D:
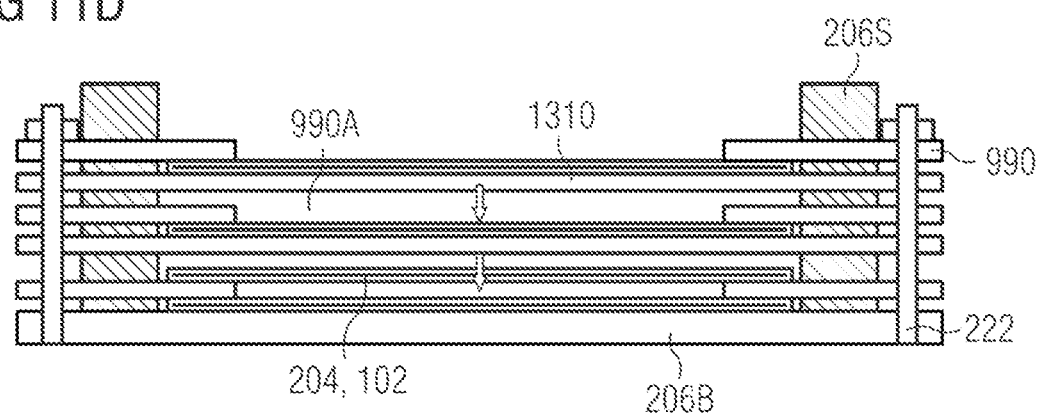
Figure 11E:
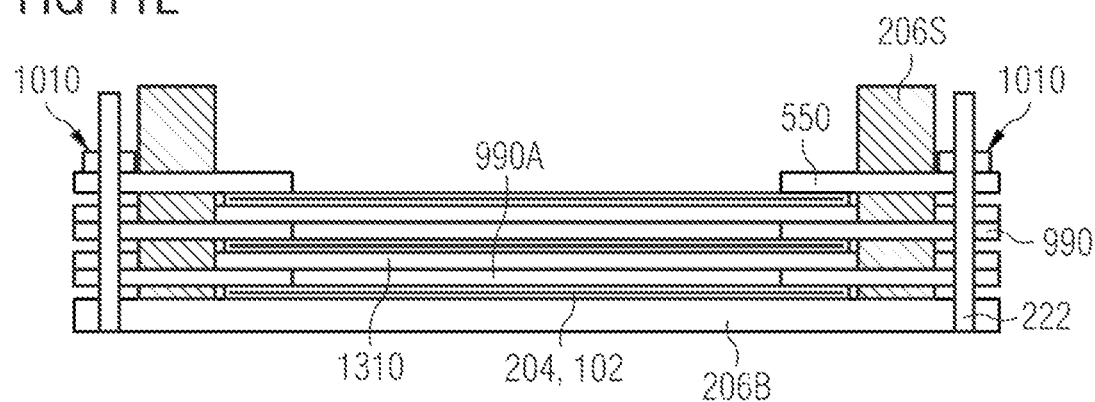
Figure 11F:
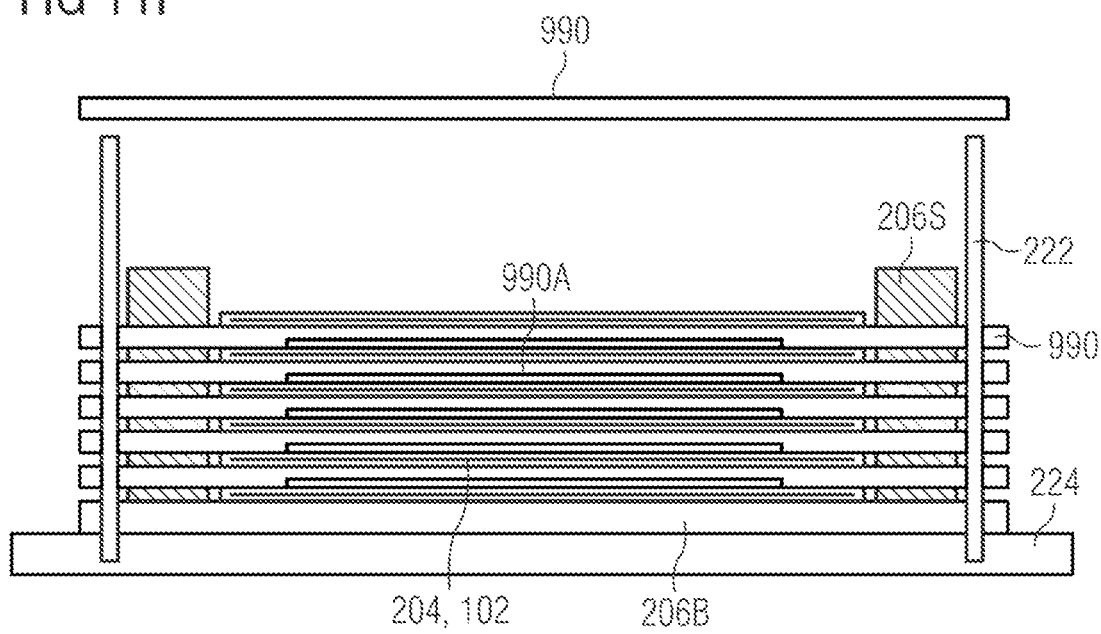

In various embodiments, contact between the wafer frames 104 and wafer carriers 990 can be avoided, e.g. by using spacers 550 (not shown) or, for example, by providing wafer carriers 990 with a recess 990A of the kind illustrated by way of example in FIG. 11D to FIG. 11F.

Instead of being arranged on conventional wafer carriers 104, the wafers 102 can also be arranged on the wafer carriers 204 according to various embodiments.

As illustrated in FIG. 9B and FIG. 9C, removal of the wafer 102 mounted on wafer frame 104, e.g. a conventional wafer frame, can be carried out in such a way that the wafer 102 is first of all removed on the wafer frame 104, and then the wafer carrier 990 provided with the guide openings.

Loading of the wafer box 206 can take place in reverse (e.g. after the first wafer 102 mounted on the wafer frame 104) by first of all arranging wafer carrier 990 in the wafer box 206 and then arranging the wafer 102 on the wafer frame 104.

Figure 10A:
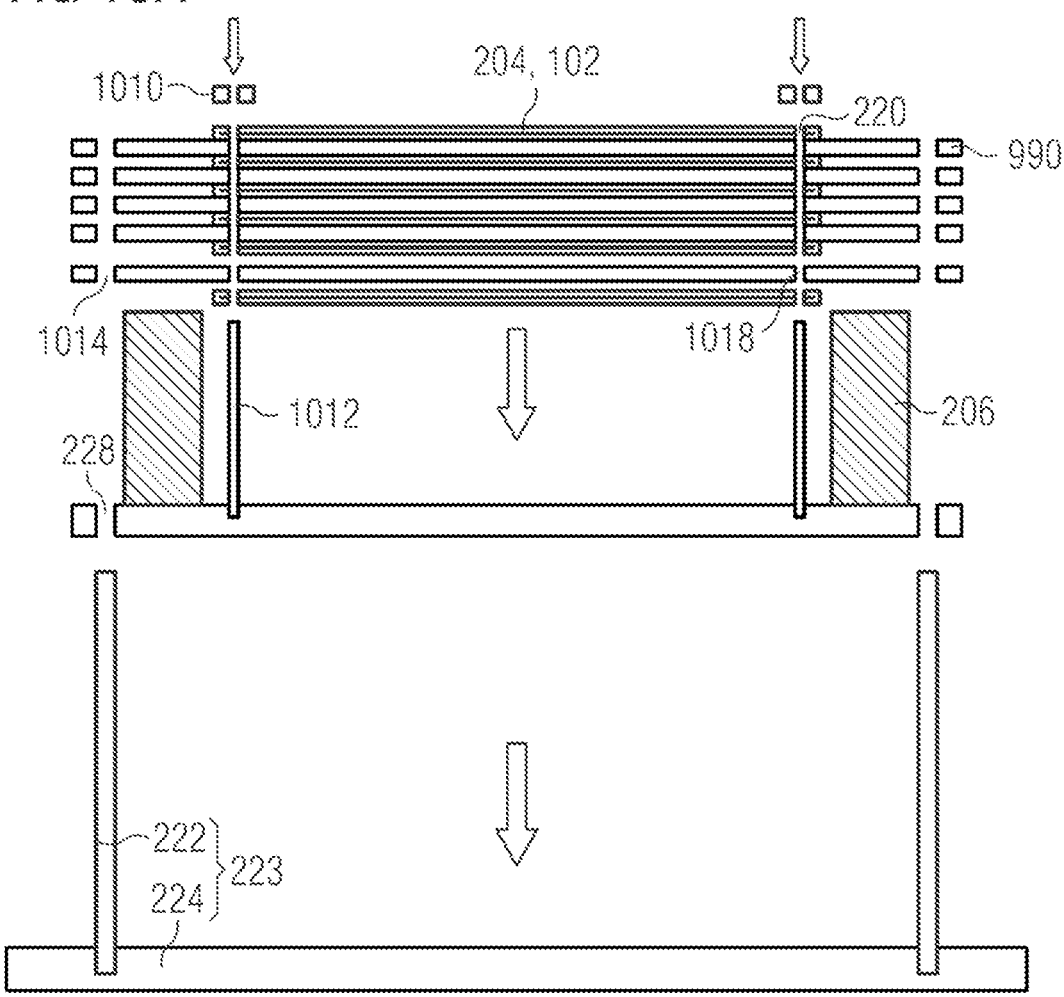
FIGS. 10A and 10B each show a schematic cross-sectional view of various embodiments to illustrate assembly of a wafer box with wafers and a stacking aid.
Figure 10B:
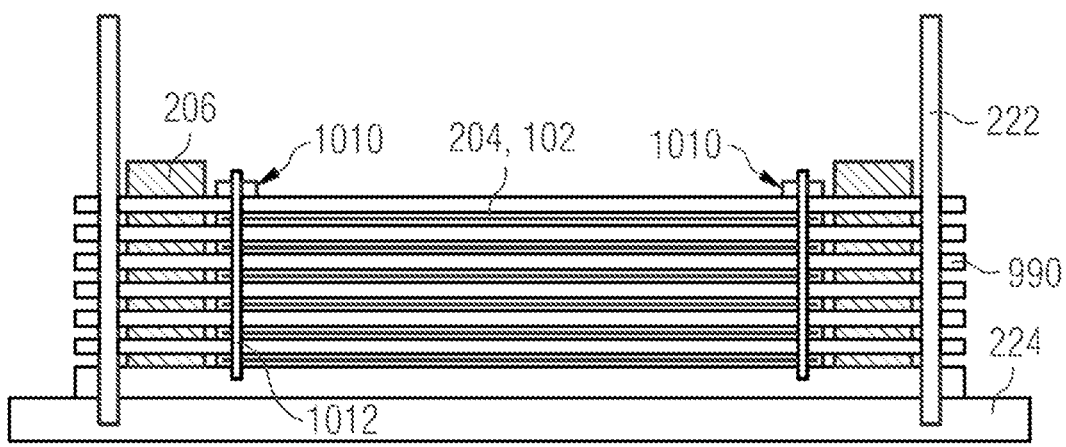

FIG. 10A and FIG. 10B each show a schematic cross-sectional view of a wafer box 206, wafer carriers 990 and wafers 102 arranged on wafer frames 204 according to various embodiments intended to illustrate assembly of the wafer box 206 with the wafers 102 and a stacking aid 223.

The embodiments shown in FIG. 10A and FIG. 10B can correspond substantially to the embodiments described above in conjunction with FIG. 9A to FIG. 9C.

In contrast or in addition thereto, the wafer box 206 can have at least one locking device 1012 (two locking devices 1012 in FIG. 10A and FIG. 10B).

For this purpose, wafer carriers 990 and the wafer frames 204 can have openings 1018, 220, which enables at least one locking device 1012 to be received. When using wafer frames 204, the guide openings 220 can be used for this purpose in various embodiments. In various embodiments, other openings or further openings can be formed in the wafer frame 204.

In various embodiments, the arrangement of the wafers 102 in the wafer box 206 can be followed by locking of the wafer stack by means of a fixing device 1010, as illustrated by way of example in FIG. 10B. In this way, the wafers 102 arranged on wafer carriers 990 and mounted on wafer frames 204 can be prevented from accidentally being removed from the wafer box 206, e.g. from falling out.

In various embodiments, the fixing device 1010 can have a clamping device, a screwing device (e.g. a nut or a ring with a radial screw) or any other suitable fixing device.

FIG. 11A to FIG. 11E each show a schematic cross-sectional view of various embodiments to illustrate assembly of a wafer box 206 with wafers 102 arranged on wafer carriers 204.

In respect of many aspects, the embodiments illustrated in FIG. 11A and FIG. 11B can be similar or identical to the embodiments described above, e.g. in respect of the functioning and interaction of at least one guide structure 222 and wafer carriers 204, which can each have at least one guide opening 220 (not shown here but see FIG. 2B), in which the at least one guide structure 222 can be arranged, in respect of the number and/or arrangement of the at least one guide structure 222 etc.

In contrast to the embodiments described above or in addition thereto, it is possible, however, for the wafer box 206 itself to be already provided with the at least one guide structure 222. Thus, it is possible to dispense with use of a stacking aid 223 of the kind described above.

In various embodiments, the at least one guide structure 222 can be arranged within the receiving space 206A, as illustrated in FIG. 11A and FIG. 11B (i.e. in a manner similar to the embodiments in FIG. 2A to FIG. 2F), with corresponding functionality and advantages.

In various embodiments, the at least one guide structure 222 can be arranged outside the receiving space 206A, as illustrated in FIG. 11C to FIG. 11E (i.e. in a manner similar to the embodiments in FIG. 9A to FIG. 10B), with corresponding functionality and effects.

Even if only embodiments with certain combinations of features are illustrated in FIG. 11A to FIG. 11F, it should be understood that the various embodiments can be combined with one another, if worthwhile. For example, the wafer carriers 204 with the wafers 102 can be arranged without the spacers 550 in the wafer box, and just one guide structure 222 or more than two guide structures 222 can be used etc.

Figure 13:
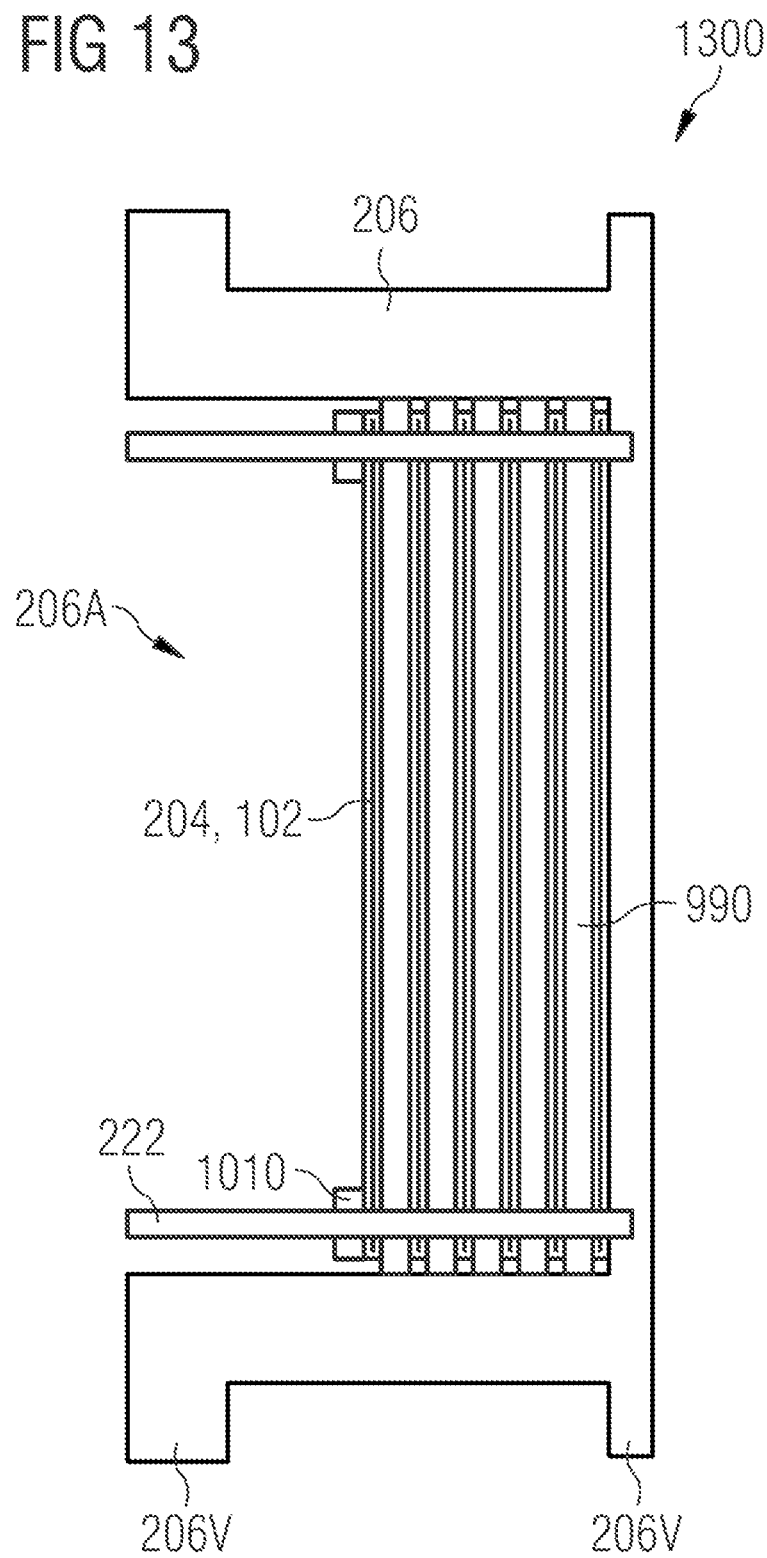
FIG. 13 shows a schematic cross-sectional view of a wafer box with wafer carriers according to various embodiments.

FIG. 13 shows a schematic cross-sectional view of a wafer box 206 with wafers 102 arranged on wafer carriers 204 according to various embodiments.

The embodiment illustrated in FIG. 13 can correspond substantially to the embodiments described above, e.g. to the embodiment described in conjunction with FIG. 11A.

FIG. 13 illustrates that the wafer box 206 according to various embodiments can be stored, loaded and unloaded in such a way that the stacked wafers 102 are arranged with their main surface substantially vertical, i.e. approximately parallel to the force of gravity.

In contrast or in addition to the embodiment illustrated in FIG. 11A, the wafer box 206 in various embodiments can be provided with projections 206V, which allow vertical arrangement on a horizontal supporting surface.

In various embodiments, a base surface of the wafer box 206 can be square or rectangular to make it easier to stand the wafer box up vertically.

In various embodiments, the base surface of the wafer box 206 can be substantially or completely round.

Figure 14:
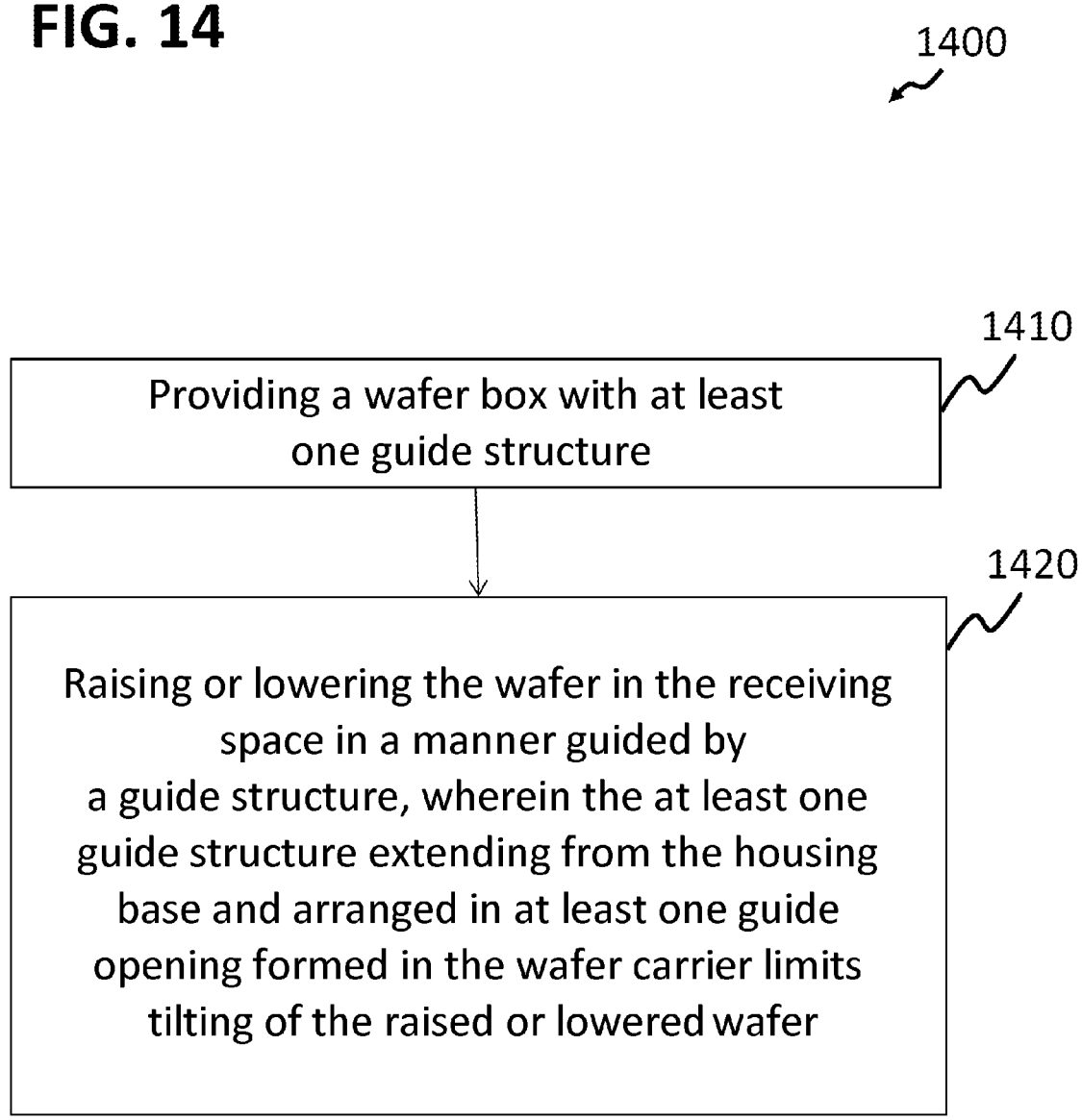
FIG. 14 shows a flow diagram relating to a method for loading a wafer box with wafers or for removing wafers from a wafer box according to various embodiments.

FIG. 14 shows a flow diagram 1400 for a method for loading a wafer box with wafers or for removing wafers from a wafer box according to various embodiments.

In various embodiments, the wafer box can have a housing with a receiving space for receiving a stack including a plurality of wafers, each arranged above a housing base with main surfaces of the wafer parallel to the housing base, in each case on a wafer carrier.

In various embodiments, the method may include providing a wafer box with at least one guide structure (in 1410) and raising or lowering the wafer in the receiving space in a manner guided by a guide structure, wherein the at least one guide structure extending from the housing base and arranged in at least one guide opening formed in the wafer carrier limits tilting of the raised or lowered wafer (in 1420).

In various embodiments, the method may furthermore include pivoting the wafer carrier about the guide structure before raising or lowering the wafer when the wafer is outside the receiving space.

In various embodiments, the method may furthermore include arranging spacers between the wafers, wherein the spacers can be positioned by means of the guide structure(s) in various embodiments. In various embodiments, a respective spacer can be arranged on, e.g. around, a plurality of guide structures, e.g. webs. In various embodiments, three or more spacers (and, accordingly, three or more guide structures) can be arranged in order to allow uniform spacing over a total wafer area.

In various embodiments, a plurality of guide structures can be used, wherein one of the guide structures can be longer than the at least one further guide structure and extends to the outside of the receiving space. In various embodiments, a single guide structure can be used, which extends to the outside of the receiving space. In various embodiments, the method may then furthermore include pivoting the wafer carrier with the wafer about the guide structure extending outside of the receiving space.

Figure 15:
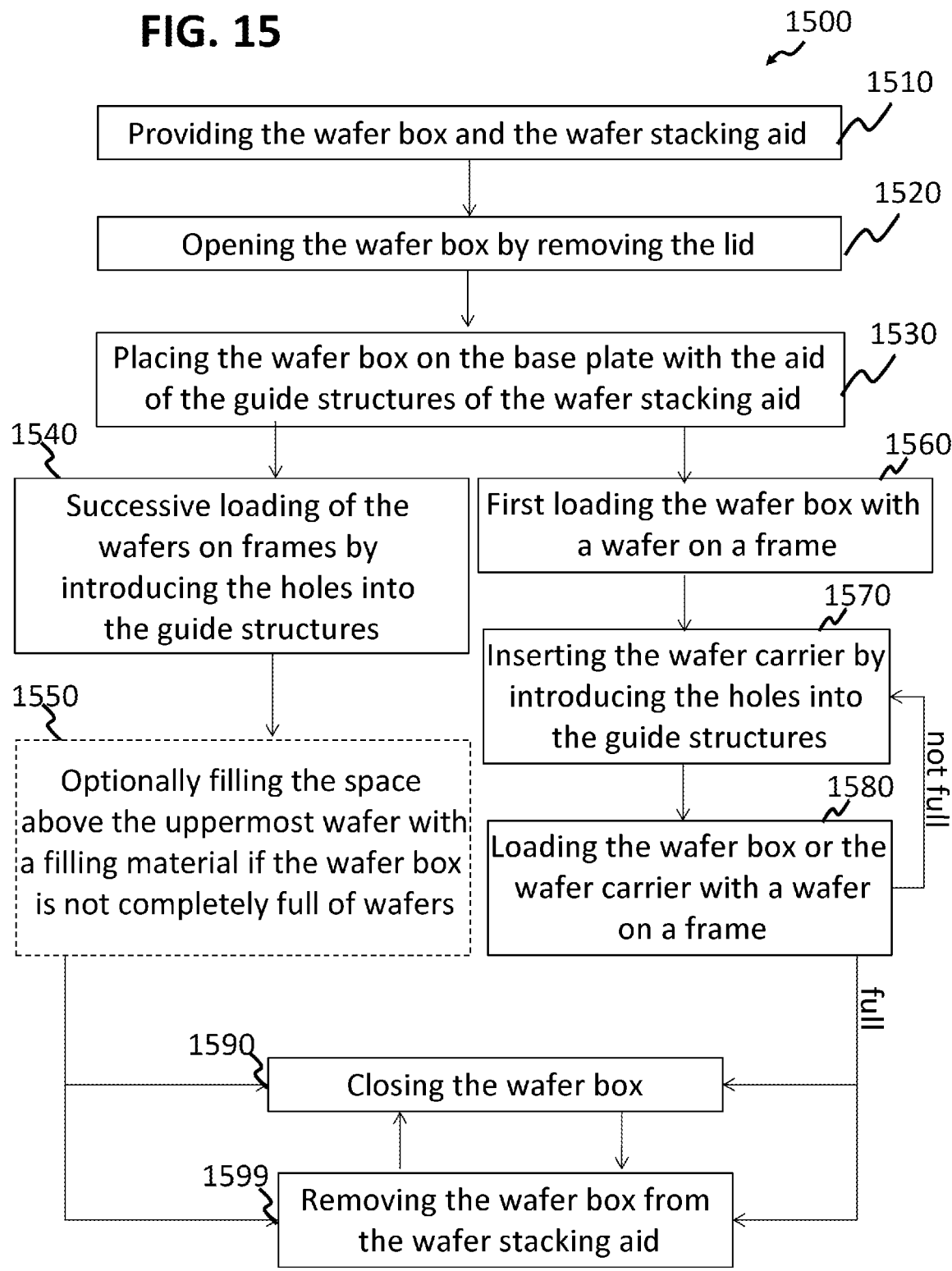
FIG. 15 shows a flow diagram relating to a method for loading a wafer box with wafers according to various embodiments.

FIG. 15 shows a flow diagram 1500 for a method for loading a wafer box with wafers according to various embodiments. Optional or illustrative processes are indicated by means of boxes in broken lines.

In various embodiments, the wafer box can have a housing with a receiving space for receiving a stack including a plurality of wafers, each arranged on a wafer carrier, in each case above a housing base with main surfaces of the wafer parallel to the housing base.

In various embodiments, the method may include providing the wafer box and a wafer stacking aid (at 1510), opening the wafer box by removing the lid (at 1520), and placing the wafer box on the base plate with the aid of the guide structures of the wafer stacking aid (at 1530).

In various embodiments, the method can then be continued in one of two variants.

In the first variant, the method may furthermore include successive loading of the wafers on frames by introducing the holes into the guide structures (at 1540), optionally filling the space above the uppermost wafer with a filling material if the wafer box is not completely full of wafers (at 1550) and, as a continuation of the method common to both variants of the method, either closing the wafer box (at 1590), followed by removing the wafer box from the wafer stacking aid (at 1599) or, conversely, first removing the wafer box from the wafer stacking aid (at 1599), followed by closing the wafer box (at 1590).

In the second variant, the method 1500 may furthermore include first loading the wafer box with a wafer on a frame (at 1560), inserting the wafer carrier by introducing the holes into the guide structures (at 1570), loading the wafer box or the wafer carrier with a wafer on a frame (at 1580), wherein insertion of the wafer carrier and loading of the wafer box can be repeated until a desired degree of filling has been achieved, and, as a continuation of the method common to both variants of the method, either closing the wafer box (at 1590), followed by removing the wafer box from the wafer stacking aid (at 1599) or, conversely, first removing the wafer box from the wafer stacking aid (at 1599), followed by closing the wafer box (at 1590).

Figure 16B:
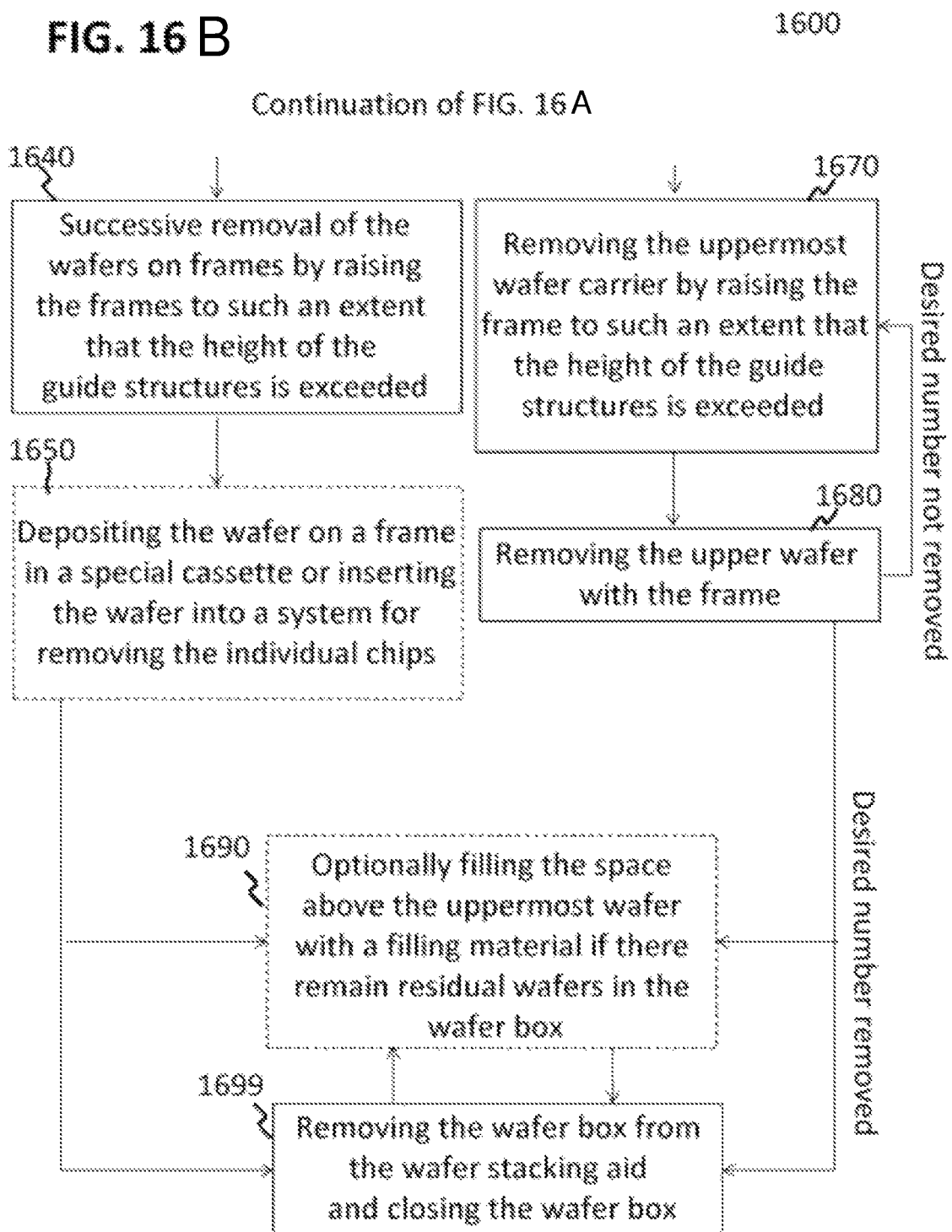

FIG. 16A and FIG. 16B show a flow diagram 1600 for a method for removing wafers from a wafer box according to various embodiments.

In various embodiments, the wafer box can have a housing with a receiving space for receiving a stack including a plurality of wafers, each arranged on a wafer carrier, in each case above a housing base with main surfaces of the wafer parallel to the housing base.

In various embodiments, the method may include providing the wafer box and a wafer stacking aid (at 1610), opening the wafer box by removing the lid (at 1620), removing any filling material above the uppermost wafer (at 1630) and positioning the wafer box on the wafer stacking aid, with the result that the guide structures of the wafer stacking enter the guide openings of the wafer frames, wherein simple introduction of the wafer box onto the wafer stacking aid is possible owing to fixing of the wafer frames in respect of horizontal rotation by virtue of the special shape of the wafer wall (at 1640).

In various embodiments, the method can then be continued in one of two variants.

In the first variant, the method may furthermore include successive removal of the wafers on frames by raising the frames to such an extent that the height of the guide structures is exceeded (at 1640), (by way of example) depositing the wafer on a frame in a special cassette or inserting the wafer into a system for removing the individual chips (at 1650), and, as a continuation of the method common to both variants of the method, either optionally filling the space above the uppermost wafer with a filling material if there remain residual wafers in the wafer box (at 1690), followed by removing the wafer box from the wafer stacking aid and closing the wafer box (at 1699) or, conversely, removing the wafer box from the wafer stacking aid and closing the wafer box (at 1699), followed by optionally filling the space above the uppermost wafer with a filling material if there remain residual wafers in the wafer box (at 1690).

In the second variant, the method may furthermore include removing the uppermost wafer carrier by raising the frame to such an extent that the height of the guide structures is exceeded (at 1670), removing the upper wafer with the frame (at 1680), wherein removal of the uppermost wafer carrier and removal of the uppermost wafer with the frame can be continued until the desired number of wafers has been removed, and, as a continuation of the method common to both variants of the method, either optionally filling the space above the uppermost wafer with a filling material if there remain residual wafers in the wafer box (at 1690), followed by removing the wafer box from the wafer stacking aid and closing the wafer box (at 1699) or, conversely, removing the wafer box from the wafer stacking aid and closing the wafer box (at 1699), followed by optionally filling the space above the uppermost wafer with a filling material if there remain residual wafers in the wafer box (at 1690).

Further features of the methods can be found in the descriptions of the devices and vice versa.

In various embodiments, the wafers can be mounted in the wafer box in such a way that it is not possible for the wafer to assume a critical angle in the vicinity of the wafer underneath during loading and removal, and therefore scratches (e.g. on a surface of the wafer underneath) due to scraping with the edge of the wafer removed are excluded. For this purpose, the wafer box (e.g. with the wafers for removal of the wafers or empty for filling with the wafers) can be inserted into a corresponding tool having at least one guide structure (e.g. one, two, three or more guide structures, e.g. common cylindrical structures such as rods, structures curved in an arc shape, hollow cylinders, cylindrical structures with a polygonal cross section, or similar, or differently shaped suitable guide structures).

In various embodiments, the at least one guide structure can be provided as part of the wafer box.

In various embodiments, at least one guide structure, e.g. as part of the wafer box or as part of a stacking aid for the wafer box, which can be inserted into at least one base opening of the wafer box, can interact in such a way with at least one guide opening in a wafer carrier that, with the guide structure inserted into the guide opening, tilting of the wafer (e.g. in relation to a direction in which the guide structure extends through the wafer) is limited. Tilting can be limited to such an extent, for example, that damage, e.g. scratching, of a wafer underneath by a wafer moved in a manner guided by the guide structure is prevented.

In various embodiments, a wafer box and a wafer frame having holes for insertion into a special guiding tool (also referred to as a wafer stacking aid) are provided. As a guide structure, the guiding tool can have two webs of equal height, for example, which can prevent the wafer assuming an angle in critical proximity to the wafer underneath.

In various embodiments, the guide structure can be designed to have a length such that complete removal of the wafer (i.e. removal of the wafer from a wafer receiving space of the wafer box and release of the wafer (or of the wafer carrier supporting the wafer) from the guide structure) takes place above a critical region of the wafer underneath, e.g. at a distance of more than half the width of a wafer carrier, making it impossible for the wafer to assume an angle in the critical region of the wafer underneath and, if the wafer is tilted (e.g. immediately) after complete removal, the distance between the wafer removed and the wafer underneath is so large that damage cannot occur despite the tilting of the wafer.

In various embodiments, the just-mentioned effect of a guide structure which has a length such that the removal of the wafer can take place outside the critical region of the wafer underneath can also apply, mutatis mutandis, to a reverse case of loading the wafer box with the wafers.

In various embodiments, the wafers can be stacked separately from one another by means of spacers. In various embodiments, the spacers can be positioned by means of the guide structure(s). In various embodiments, a respective spacer can be arranged at, e.g. around, a plurality of guide structures, e.g. webs. In various embodiments, three or more spacers (and, accordingly, three or more guide structures) can be used to allow uniform spacing over a complete wafer area. In various embodiments, the spacers can be used if very thick wafers are to be stacked, e.g. wafers with a thickness which is greater than a thickness of the wafer frames (which can also be referred to as sawing frames) or when using very thin wafer frames, e.g. metal frames. In various embodiments, positioning the spacers by means of the guide structures can make it possible to use a plurality of individual spacers (e.g. instead of one spacer which can be shaped like the wafer frame and, for example, can be secured in the same way as the latter against slipping and turning), thereby making it possible to save material and to increase the versatility of the spacers.

In various embodiments, a single guide structure can be used, which extends as far as the outside of the receiving space. In various embodiments, a plurality of guide structures can be used. One of the guide structures can be longer than the at least one further guide structure and extends as far as the outside of the receiving space. In this case, safety in the handling of the wafers, i.e. when loading the wafer box and when removing wafers from the wafer box, can be even further increased since the removal of the wafer can now be carried out with a lateral offset relative to the storage box. In various embodiments, it is possible, for wafer removal, for the wafer initially to be raised out of the receiving space in a manner guided by the guide structure(s) and, after reaching a position in which the wafer is outside the receiving space and there is (still) only one (optionally relatively long) guide structure within (an) the opening in the wafer carrier, for the wafer to be pivoted in such a way about the guide structure that the wafer to be removed is essentially no longer above the wafer box.

In various embodiments, the wafer carrier which has the guide opening for the guide structure can be a wafer frame, e.g. a sawing frame, which is similar to the conventional wafer frames, apart from the fact that it has the guide opening(s).

In various embodiments, the wafer carrier can be an additional wafer carrier, e.g. a spacer, which has the at least one guide opening. The additional wafer carrier can enable guidance outside the receiving space of the wafer box. This makes it possible to use conventional unperforated wafer frames, which can be arranged on the additional carrier.

In various embodiments, the wafer box and the wafer stacking aid can be matched to one another, thus enabling them to interact in order to allow loading of the wafer box with the wafers arranged on the wafer carriers (matched to the wafer box and the wafer stacking aid) without the wafer underneath being damaged during the respective insertion or removal of one of the wafers as a result of tilting of the inserted or removed wafer.

In various embodiments, the wafer box can be configured in such a way that, by way of clear description, the wafer stacking aid is as it were integrated into the wafer box. For this purpose, the wafer box can be provided with at least one guide structure in order to enable the wafer box to be loaded with the wafers arranged on the wafer carriers (matched to the wafer box) without the wafer underneath being damaged during the respective insertion or removal of one of the wafers as a result of tilting of the inserted or removed wafer.

In various embodiments, a wafer box is provided. The wafer box can have a housing with a receiving space for receiving a stack including a plurality of wafers, each arranged above a housing base, wherein the wafers are to be arranged with their main surfaces parallel to the housing base and wherein the receiving space is delimited by the housing base and side walls arranged thereon, and at least one guide structure, which is connected to the housing base and extends from the housing base in order to limit tilting of a wafer raised or lowered in the receiving space in a manner guided by the guide structure.

In various embodiments, a mean clearance between an inner edge of the at least one guide opening and a surface of the at least one guide structure inserted therein can be at most 5 mm.

In various embodiments, a wafer box is provided. The wafer box can have a housing with a receiving space for receiving a stack including a plurality of wafers, each arranged above a housing base, wherein the wafers are to be arranged with their main surfaces parallel to the housing base and wherein the receiving space is delimited by the housing base and side walls arranged thereon, and at least one base opening, arranged in the housing base, for receiving a guide structure of a wafer stacking aid, wherein the guide structure is to be arranged in such a way that, on a side of the housing base on which the side walls are arranged, it extends out of the housing base in order to limit tilting of a wafer raised or lowered in the receiving space in a manner guided by the guide structure.

In various embodiments, the at least one base opening can be arranged in a base region below the receiving space.

In various embodiments, the at least one base opening can be arranged in a region of the housing base which can be situated on a side of the side walls facing away from the receiving space.

In various embodiments, it is possible for no side wall to be arranged between a region in which the guide structure is to be arranged and the receiving space.

In various embodiments, the at least one base opening can have a plurality of base openings.

In various embodiments, the plurality of base openings can be arranged at uniform angular intervals with respect to one another.

In various embodiments, a wafer stacking aid for a wafer box according to various embodiments is provided. The wafer stacking aid can have a base plate, and at least one guide structure extending out of the base plate, wherein the wafer stacking aid can be arranged below the wafer box in such a way that, on the side of the housing base on which the side walls are arranged, the guide structure extends out of the housing base of the wafer box in order to limit tilting of a wafer raised or lowered in the receiving space by means of the guide structure.

In various embodiments, a number of the guide structures of the wafer stacking aid can correspond to a number of the base openings in the wafer box.

In various embodiments, the at least one guide structure can have a cylindrical guide structure which is long enough to extend beyond an upper edge of the side walls of the wafer box.

In various embodiments, at least one guide structure may include a metal.

In various embodiments, a free end of the at least one guide structure can be designed to taper toward the free end.

In various embodiments, a wafer carrier for the arrangement of a wafer in a wafer box according to various embodiments with the aid of a wafer stacking aid according to various embodiments will have a surface for supporting a wafer, a rim region outside the surface for supporting the wafer, and at least one guide opening in the rim region for receiving the guide structure, wherein the wafer carrier is configured in such a way that tilting of a wafer raised or lowered in the receiving space in a manner guided by the guide structure received in the at least one receiving opening can be limited.

In various embodiments, a wafer transport system is provided. The wafer transport system can have a wafer box according to various embodiments and a wafer stacking aid according to various embodiments.

In various embodiments, the wafer transport system can furthermore have at least one wafer carrier according to various embodiments.

In various embodiments, a method for loading a wafer box with wafers or for removing wafers from a wafer box is provided, wherein the wafer box has a housing with a receiving space for receiving a stack including a plurality of wafers, each arranged on a wafer carrier, in each case above a housing base, with main surfaces of the wafer parallel to the housing base. The method may include raising or lowering the wafer in the receiving space with guidance by a guide structure, wherein the at least one guide structure, which extends from the housing base and is arranged in at least one guide opening formed in the wafer carrier, can limit tilting of the raised or lowered wafer.

In various embodiments, the method may furthermore include pivoting the wafer carrier about the guide structure before raising or lowering the wafer, when the wafer is outside the receiving space.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A wafer box, comprising:
a housing with a receiving space for receiving a stack comprising a plurality of wafers, each arranged above a housing base, wherein the wafers are to be arranged with their main surfaces parallel to the housing base and wherein the receiving space is delimited by the housing base and side walls arranged thereon; and
at least one guide structure, which is connected to the housing base and extends from the housing base in order to limit tilting of a wafer raised or lowered in the receiving space in a manner guided by the guide structure,
wherein the side walls and any interruptions of the sidewalls define a virtual perimeter so that the receiving space is disposed within the virtual perimeter and the guide structure is disposed entirely outside of the virtual perimeter.

2. The wafer box of claim 1,
wherein a mean clearance between an inner edge of at least one guide opening and a surface of the at least one guide structure inserted therein is at most 5 mm.

3. A wafer box, comprising:
a housing with a receiving space for receiving a stack comprising a plurality of wafers, each arranged above a housing base, wherein the wafers are to be arranged with their main surfaces parallel to the housing base and wherein the receiving space is delimited by the housing base and side walls arranged thereon; and
at least one base opening, arranged in the housing base, for receiving a guide structure of a wafer stacking aid, wherein the guide structure is to be arranged in such a way that, on a side of the housing base on which the side walls are arranged, it extends out of the housing base in order to limit tilting of a wafer raised or lowered in the receiving space in a manner guided by the guide structure,
wherein the side walls and any interruptions of the sidewalls define a virtual perimeter so that the receiving space is arranged within the virtual perimeter and the base opening is arranged entirely outside of the virtual perimeter.

4. The wafer box of claim 3,
wherein the at least one base opening is arranged in a base region below the receiving space.

5. The wafer box of claim 3,
wherein the at least one base opening is arranged in a region of the housing base which is situated on a side of the side walls facing away from the receiving space.

6. The wafer box of claim 5,
wherein no side wall is arranged between a region in which the guide structure is to be arranged and the receiving space.

7. The wafer box of claim 3,
wherein the at least one base opening has a plurality of base openings.

8. The wafer box of claim 7,
wherein the plurality of base openings is arranged at uniform angular intervals with respect to one another.

9. A wafer stacking aid for a wafer box,
a base plate; and
at least one guide structure extending out of the base plate;
wherein the wafer stacking aid is configured to be arranged below the wafer box so that, on a side of a housing base of the wafer box on which side walls are arranged, the at least one guide structure extends out of the housing base of the wafer box in order to limit tilting of a wafer raised or lowered in a receiving space of the wafer box in a manner guided by the guide structure,
wherein the side walls and any interruptions of the sidewalls define a virtual perimeter so that the receiving space is arranged within the virtual perimeter and the at least one guide structure is arranged entirely outside of the virtual perimeter.

10. The wafer stacking aid of claim 9,
wherein a number of guide structures of the wafer stacking aid corresponds to a number of base openings in the wafer box.

11. The wafer stacking aid of claim 9,
wherein the at least one guide structure has a cylindrical guide structure which is long enough to extend beyond an upper edge of the side walls of the wafer box.

12. The wafer stacking aid of claim 9,
wherein the at least one guide structure comprises a metal.

13. The wafer stacking aid of claim 9,
wherein a free end of the at least one guide structure is designed to taper toward the free end.

14. A wafer carrier for arrangement of a wafer in a wafer box, the wafer carrier comprising:
a surface for supporting a wafer;
a rim region outside the surface for supporting the wafer, the rim region comprising
at least one projection configured to extend beyond a sidewall of the wafer box; and
at least one guide opening in the at least one projection of the rim region for receiving a guide structure;
wherein the wafer carrier is configured in such a way that tilting of a wafer raised or lowered in a receiving space by means of the guide structure received in the at least one receiving opening is limited.

15. A wafer transport system, comprising:
a wafer box, comprising:
a housing with a receiving space for receiving a stack comprising a plurality of wafers, each arranged above a housing base, wherein the wafers are to be arranged with their main surfaces parallel to the housing base and wherein the receiving space is delimited by the housing base and side walls arranged thereon; and
at least one base opening, arranged in the housing base, for receiving a guide structure of a wafer stacking aid, wherein the guide structure is to be arranged so that, on a side of the housing base on which the side walls are arranged, the guide structure extends out of the housing base in order to limit tilting of a wafer raised or lowered in the receiving space in a manner guided by the guide structure,
wherein the side walls and any interruptions of the sidewalls define a virtual perimeter so that the receiving space is arranged within the virtual perimeter and the guide structure is arranged entirely outside of the virtual perimeter;
a wafer stacking aid, comprising:
a base plate; and
at least one guide structure extending out of the base plate;
wherein the wafer stacking aid can be arranged below the wafer box in such a way that, on the side of the housing base on which the side walls are arranged, the guide structure extends out of the housing base of the wafer box in order to limit tilting of a wafer raised or lowered in the receiving space in a manner guided by the guide structure.

16. The wafer transport system of claim 15, further comprising:
at least one wafer carrier, comprising:
a surface for supporting a wafer;
a rim region outside the surface for supporting the wafer; and
at least one guide opening in the rim region for receiving the guide structure;
wherein the wafer carrier is configured in such a way that tilting of a wafer raised or lowered in the receiving space by means of the guide structure received in the at least one receiving opening is limited.

17. The method of claim 1, wherein the virtual perimeter is circular.

* * * * *